(12) United States Patent
Takahashi et al.

(10) Patent No.: US 12,323,137 B2
(45) Date of Patent: Jun. 3, 2025

(54) GATE DRIVE CIRCUIT, GATE DRIVE DEVICE, HIGH-FREQUENCY POWER SUPPLY DEVICE, AND SYSTEM

(71) Applicant: Panasonic Intellectual Property Management Co., Ltd., Osaka (JP)

(72) Inventors: Koji Takahashi, Osaka (JP); Manabu Yanagihara, Osaka (JP); Noboru Negoro, Osaka (JP); Takeshi Azuma, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 16 days.

(21) Appl. No.: 18/264,556

(22) PCT Filed: Oct. 13, 2021

(86) PCT No.: PCT/JP2021/037830
§ 371 (c)(1),
(2) Date: Aug. 7, 2023

(87) PCT Pub. No.: WO2022/176268
PCT Pub. Date: Aug. 25, 2022

(65) Prior Publication Data
US 2024/0048139 A1 Feb. 8, 2024

(30) Foreign Application Priority Data
Feb. 22, 2021 (JP) .................................. 2021-026815

(51) Int. Cl.
*H03K 17/30* (2006.01)
*H03K 17/0412* (2006.01)
(Continued)

(52) U.S. Cl.
CPC ..... *H03K 17/302* (2013.01); *H03K 17/04123* (2013.01); *H03K 19/0013* (2013.01); *H03K 19/00361* (2013.01)

(58) Field of Classification Search
None
See application file for complete search history.

(56) References Cited

U.S. PATENT DOCUMENTS

| | | | |
|---|---|---|---|
| 8,558,587 B2 * | 10/2013 | Machida | ................. H02M 1/08 327/427 |
| 2002/0021162 A1 * | 2/2002 | Pinna | .................. H03K 17/165 327/390 |
| 2012/0306545 A1 | 12/2012 | Machida et al. | |

FOREIGN PATENT DOCUMENTS

| | | |
|---|---|---|
| JP | 2006-296119 A | 10/2006 |
| JP | 2010-051165 A | 3/2010 |

(Continued)

OTHER PUBLICATIONS

International Search Report issued on Dec. 28, 2021 in International Patent Application No. PCT/JP2021/037830, with English translation.

*Primary Examiner* — Jung Kim
(74) *Attorney, Agent, or Firm* — Rimon P.C.

(57) ABSTRACT

A gate drive circuit that drives a switching element including a first drain, a first source, and a first gate includes: a first terminal to which a gate control signal is input; a gate signal line connecting the first terminal and the first gate; a resistance element inserted in the gate signal line; a capacitance element connected in parallel with the resistance element; a clamp circuit that performs a clamp operation of clamping a voltage between the first gate and the first source to a voltage lower than a threshold voltage of the switching element when the gate control signal indicates an off period of the switching element; and a clamp control circuit that controls (Continued)

whether to prohibit the clamp operation of the clamp circuit in the off period.

19 Claims, 16 Drawing Sheets

(51) Int. Cl.
    *H03K 19/00*    (2006.01)
    *H03K 19/003*    (2006.01)

(56) References Cited

FOREIGN PATENT DOCUMENTS

| | | |
|---|---|---|
| JP | 2012-199763 A | 10/2012 |
| JP | 2013-013044 A | 1/2013 |
| JP | 6313080 B2 | 4/2018 |

\* cited by examiner

GATE DRIVE CIRCUIT, GATE DRIVE DEVICE, HIGH-FREQUENCY POWER SUPPLY DEVICE, AND SYSTEM

CROSS-REFERENCE OF RELATED APPLICATIONS

This application is the U.S. National Phase under 35 U.S.C. § 371 of International Patent Application No. PCT/JP2021/037830, filed on Oct. 13, 2021, which in turn claims the benefit of Japanese Patent Application No. 2021-026815, filed on Feb. 22, 2021, the entire disclosures of which applications are incorporated by reference herein.

TECHNICAL FIELD

The present disclosure relates to a gate drive circuit, a gate drive device, a high-frequency power supply device, and a system.

BACKGROUND ART

Patent Literature (PTL) 1 discloses a technique of, in a gate drive circuit of a wide bandgap semiconductor switch such as GaN, short-circuiting a gate and a source during a period in which a control signal indicates off. This is intended to prevent malfunctions in the off state of the semiconductor switch.

PTL 2 relates to a high-frequency power supply device including a switch that performs DC/RF conversion, i.e. conversion of direct-current (DC) power into high-frequency power, and discloses a switch driver that detects load-side impedance and optimizes the peak value of a drive signal to be provided to the switch with respect to the detected impedance. This is intended to reduce power loss in the high-frequency power supply device.

CITATION LIST

Patent Literature

[PTL 1]
Japanese Unexamined Patent Application Publication No. 2012-199763
[PTL 2]
Japanese Patent No. 6313080

SUMMARY OF INVENTION

Technical Problem

With the technique described in PTL 1, since the gate and the source are short-circuited during the period in which the control signal indicates off, a speed-up capacitor is charged and discharged in each switching cycle. This causes an increase in power consumption. With the technique described in PTL 2, there is a possibility of false turn-on during the response time from when the load-side impedance is detected to when the peak value of the drive signal is changed to the optimum value.

The present disclosure therefore provides a gate drive circuit, gate drive device, high-frequency power supply device, and system that achieve both lower power consumption and suppression of false turn-on.

Solution to Problem

A gate drive circuit according to an aspect of the present disclosure is a gate drive circuit that drives a switching element including a first drain, a first source, and a first gate, the gate drive circuit including: a first terminal to which a gate control signal is input; a gate signal line connecting the first terminal and the first gate; a resistance element inserted in the gate signal line; a capacitance element connected in parallel with the resistance element; a clamp circuit that performs a clamp operation of clamping a voltage between the first gate and the first source to a voltage lower than a threshold voltage of the switching element when the gate control signal indicates an off period of the switching element; and a clamp control circuit that controls whether to prohibit the clamp operation of the clamp circuit in the off period.

With this, both lower power consumption and suppression of false turn-on can be achieved.

The gate drive circuit may include: a diode connected in parallel with the resistance element and including an anode connected to the first gate.

With this, even if the first gate voltage of the switching element rises due to reflected power caused by a load mismatch, the rise of the gate voltage is limited to not greater than forward drop voltage VF of the diode, so that false turn-on can be further suppressed.

The clamp circuit may include: a first transistor switch connected between the first gate and the first source; and a second transistor switch connected in parallel with the first transistor switch. With this, as a result of the transistor switches being turned on, the clamp voltage between the first gate and the first source is substantially 0 V, i.e. lower than the threshold voltage of the switching element. Since the two transistor switches connected in parallel are used for clamping, the impedance between the gate and the source during clamping can be further lowered, and false turn-on can be suppressed more effectively.

The gate drive circuit may include: an inverter that inverts a signal input to a gate of one of the first transistor switch and the second transistor switch and outputs the signal inverted to a gate of an other one of the first transistor switch and the second transistor switch, and a channel of the first transistor switch and a channel of the second transistor switch may differ in polarity.

With this, the two transistor switches connected in parallel in CMOS configuration are used for clamping, so that the impedance between the gate and the source during clamping can be further lowered and false turn-on can be further suppressed.

The clamp control circuit may include: a delay circuit that causes a delay of the gate control signal from the first terminal; and a logic circuit that generates a timing signal indicating a timing of the off period of the switching element based on a logical AND or logical OR of the gate control signal before the delay and the gate control signal after the delay, and the clamp circuit may perform the clamp operation depending on the timing signal.

With this, the clamp period by the clamp circuit can be kept from exceeding the range of the off period of the switching element. Consequently, the clamp operation can be prevented from affecting the on period of the switching element.

An amount of the delay by the delay circuit may be variable.

With this, the delay amount is adjustable, so that the clamp operation can be effectively performed without affecting the on period of the switching element.

The logic circuit may receive input of an output state signal indicating a state of output power by switching of the switching element, and prohibit the clamp operation of the clamp circuit depending on the output state signal.

With this, whether to prohibit the clamp operation can be controlled dynamically depending on the state of the output power to the load. It is thus possible to achieve both low power consumption and suppression of false turn-on in a well-balanced manner.

The clamp control circuit may prohibit the clamp operation of the clamp circuit depending on an output state signal indicating a state of output power by switching of the switching element.

With this, whether to prohibit the clamp operation can be controlled dynamically depending on the state of the output power to the load. It is thus possible to achieve both low power consumption and suppression of false turn-on in a well-balanced manner.

The output state signal may be based on at least one of information indicating reflected-wave power of the output power or information indicating traveling-wave power of the output power.

With this, the output state signal indicates whether false turn-on is likely to occur, and therefore whether to prohibit the clamp operation can be controlled dynamically depending on the state of the output power to the load. Consequently, both lower power consumption and suppression of false turn-on can be achieved in a well-balanced manner.

The gate drive circuit may include: a test circuit that prohibits the clamp operation by forcing the output state signal to a predetermined level, depending on a test signal input from outside.

With this, it is possible to compare, test, and evaluate the operation when the clamp operation is prohibited and the operation when the clamp operation is not prohibited. This allows the clamp control circuit to perform well-balanced clamp control that suppresses false turn-on and enables low power consumption driving.

A distance between (i) a connection point of the clamp circuit and the gate signal line and (ii) the first gate in the gate signal line may be less than a distance between the connection point and the resistance element in the gate signal line.

With this, the influence of the wiring capacitance of the gate signal line in the vicinity of the gate is reduced, allowing more effective clamp operation.

A gate drive device according to an aspect of the present disclosure includes: the gate drive circuit; and a state detection circuit that generates the output state signal, wherein the state detection circuit: detects at least one parameter indicating a state of output power from the switching element; converts the at least one parameter into respective at least one binarized parameter indicating whether there is a possibility of false turn-on by threshold determination; determines whether the at least one binarized parameter satisfies a predetermined condition; and generates a determination result as the output state signal that is binary.

With this, the state of the output power that changes depending on the operation state of the load is detected. This allows the clamp control circuit to dynamically control whether to prohibit the clamp operation depending on the operation state of the load. Consequently, both lower power consumption and suppression of false turn-on can be achieved, and their balance can be dynamically optimized.

The at least one parameter may include a parameter indicating traveling-wave power of the output power and a parameter indicating reflected-wave power of the output power.

With this, an impedance mismatch, i.e. the possibility of false turn-on, can be estimated from the detection result of at least one of traveling-wave power or reflected-wave power. The output state signal as a result of threshold determination indicates whether false turn-on is likely to occur. Hence, the clamp control circuit can prohibit the clamp operation in the case where false turn-on is likely to occur, and perform the clamp operation without prohibiting it in the case where the possibility of false turn-on is not high.

The at least one parameter may include a parameter indicating a voltage value of the output power, a parameter indicating a current value of the output power, and a parameter indicating a power value of the output power.

With this, an impedance mismatch, i.e. the possibility of false turn-on, can be estimated from the detection result. The output state signal as a result of threshold determination indicates whether false turn-on is likely to occur. Hence, the clamp control circuit can prohibit the clamp operation in the case where false turn-on is likely to occur, and perform the clamp operation without prohibiting it in the case where the possibility of false turn-on is not high.

The predetermined condition may be an AND condition of one or more binarized parameters selected from the at least one binarized parameter.

A high-frequency power supply device according to an aspect of the present disclosure includes the gate drive device and the switching element.

With this, both lower power consumption and suppression of false turn-on can be achieved.

The high-frequency power supply device may include: a positive power supply terminal; a negative power supply terminal; and a load inductor having a first end connected to the positive power supply terminal and a second end connected to the first drain, and the first source and the negative power supply terminal may be connected to each other.

Such a high-frequency power supply device can be provided as a class E high-frequency power supply including the foregoing gate drive circuit. Consequently, both lower power consumption and suppression of false turn-on can be achieved, and their balance can be dynamically optimized.

The high-frequency power supply device may include: a positive power supply terminal; a negative power supply terminal; two switching elements, each of which is the switching element, connected in series between the positive power supply terminal and the negative power supply terminal; and two gate drive circuits, each of which is the gate drive circuit, corresponding to the two switching elements, and the two gate drive circuits may exclusively cause the two switching elements to be conductive.

Such a high-frequency power supply device can be provided as a high-frequency power supply of class D half-bridge configuration including the foregoing gate drive device. Consequently, both lower power consumption and suppression of false turn-on can be achieved, and their balance can be dynamically optimized.

The high-frequency power supply device may include: a positive power supply terminal; a negative power supply terminal; a first leg including two switching elements, each of which is the switching element, connected in series between the positive power supply terminal and the negative power supply terminal; a second leg including other two switching elements, each of which is the switching element, connected in series between the positive power supply terminal and the negative power supply terminal; and four gate drive circuits, each of which is the gate drive circuit, corresponding to the two switching elements and the other two switching elements, and the four gate drive circuits may: exclusively cause the two switching elements in the first leg to be conductive; exclusively cause the other two switching elements in the second leg to be conductive; simultaneously cause the switching element as a high side switch in the first leg and the switching element as a low side switch in the second leg to be conductive; and simultaneously cause the switching element as a high side switch in the second leg and the switching element as a low side switch in the first leg to be conductive.

Such a high-frequency power supply device can be provided as a high-frequency power supply of class D full-bridge configuration including the foregoing gate drive device. Consequently, both lower power consumption and suppression of false turn-on can be achieved, and their balance can be dynamically optimized.

A system according to an aspect of the present disclosure includes the high-frequency power supply device and a load connected to the high-frequency power supply device.

With this, both lower power consumption and suppression of false turn-on can be achieved.

These general and specific aspects may be implemented using a system, a method, or an integrated circuit, or implemented using any combination of a system, a method, and an integrated circuit.

Advantageous Effects of Invention

The gate drive circuit, gate drive device, high-frequency power supply device, and system according to the present disclosure can achieve both lower power consumption and suppression of false turn-on.

DESCRIPTION OF EMBODIMENTS

Embodiments will be described in detail below with reference to the drawings.

Each of the exemplary embodiments described below shows a general or specific example. The numerical values, shapes, materials, elements, the arrangement and connection of the elements, steps, the processing order of the steps etc. shown in the following exemplary embodiments are mere examples, and do not limit the scope of the present disclosure.

Embodiment 1

A gate drive circuit according to this embodiment drives, for example, a switching element included in a high-frequency power supply device that supplies high-frequency power to a load such as a plasma generation device.

[1.1 Structure of Gate Drive Circuit]

Figure 1A:
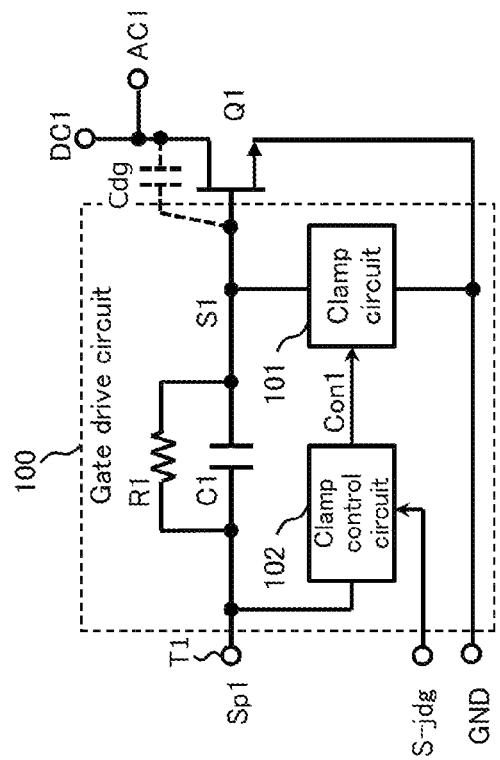
FIG. 1A is a diagram illustrating an example of the structure of a gate drive circuit according to Embodiment 1.

FIG. 1A is a diagram illustrating an example of the structure of gate drive circuit 100 according to Embodiment 1. In the drawing, switching element Q1 to be driven is illustrated in addition to gate drive circuit 100.

Switching element Q1 is, for example, a power semiconductor element such as a GaNFET, and includes a first drain, a first source, and a first gate. The first drain is connected to DC power supply terminal DC1, and supplied with a positive DC voltage. The first source is connected to a ground or a negative terminal. The first gate is supplied with a gate control signal via a gate signal line. Cdg in the drawing denotes the parasitic capacitance between the drain and the gate.

The gate signal line is a signal line from first terminal T1 to the first gate. In the drawing, resistance element R1 and capacitance element C1 are inserted in the gate signal line. A gate control signal input to first terminal T1 is denoted as Sp1, and a gate control signal input to the first gate is denoted as S1.

Gate drive circuit 100 in the drawing includes resistance element R1, capacitance element C1, clamp circuit 101, and clamp control circuit 102.

Resistance element R1 is inserted in the gate signal line, and has a resistance value for appropriately regulating the value of current flowing to the gate by gate control signal Sp1 input to first terminal T1.

Capacitance element C1 is a speed-up capacitor.

Clamp circuit 101 clamps the voltage between the first gate and the first source to a voltage lower than the threshold voltage of switching element Q1 when gate control signal Sp1 indicates an off period of switching element Q1. The clamping is intended to suppress noise generated at the gate when switching element Q1 is off.

The noise generated at the first gate will be described below. When the impedance mismatch between the high-frequency power supply device including gate drive circuit 100 and the load is greater, the reflected-wave component of the high-frequency power from the load is greater. Part of the reflected-wave component appears as noise at the first gate from the load via parasitic capacitance Cdg between the drain and the gate of switching element Q1 in the high-frequency power supply device. If the reflected-wave component is large, the noise component of the first gate may exceed the threshold voltage of switching element Q1. Such a noise component causes false turn-on of switching element Q1. In the case where the impedance matches between the high-frequency power supply device and the load, the reflected-wave component is small and the noise component is small, and false turn-on is unlikely to occur.

Clamp control circuit 102 controls whether to prohibit the clamp operation of clamp circuit 101 in the off period indicated by gate control signal Sp1. For example, in the state of the foregoing impedance match, the noise component is small, so that the possibility of false turn-on is low even when the clamp operation is prohibited. In the state of the foregoing impedance mismatch, the noise component is large, and accordingly the clamp operation is not prohibited but performed to suppress false turn-on.

For example, clamp control circuit 102 controls whether to prohibit the clamp operation regardless of the off period and the on period, depending on state determination signal S-jdg. State determination signal S-jdg is an example of an output state signal indicating the state of output power by switching of switching element Q1, and is a signal indicating whether the impedance matches or mismatches. In other words, state determination signal S-jdg is a signal indicating whether false turn-on is likely to occur. In the case where state determination signal S-jdg indicates the state of impedance match, that is, indicates that false turn-on is unlikely to occur, clamp control circuit 102 prohibits the clamp operation. In the case where state determination signal S-jdg indicates the state of impedance mismatch, that is, indicates that false turn-on is likely to occur, clamp control circuit 102 does not prohibit the clamp operation and causes clamp circuit 101 to perform the clamp operation.

The distance between (i) the connection point of clamp circuit 101 and the gate signal line and (ii) the first gate in the gate signal line may be less than the distance between the connection point and resistance element R1 in the gate signal line. Thus, the influence of the wiring capacitance of the gate signal line in the vicinity of the gate is reduced, allowing more effective clamp operation.

A more specific circuit example of gate drive circuit 100 will be described below.

Figure 1B:
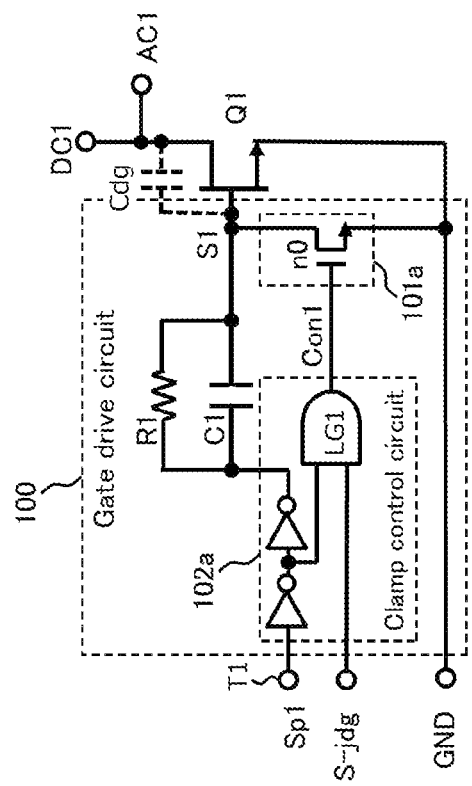
FIG. 1B is a diagram illustrating a specific example of the gate drive circuit according to Embodiment 1.

FIG. 1B is a diagram illustrating a specific example of the gate drive circuit according to Embodiment 1. In the drawing, the differences from gate drive circuit 100 in FIG. 1A lie in that clamp circuit 101a and clamp control circuit 102a are provided instead of clamp circuit 101 and clamp control circuit 102. The differences in FIG. 1B from FIG. 1A will be mainly described below while omitting the description of the same parts.

Clamp circuit 101a is composed of transistor switch n0 connected between the first gate and the first source of switching element Q1. Transistor switch n0 is, for example, an N-type MOSFET, and is turned on to short-circuit the first gate and the first source with low impedance when clamp control signal Con1 input to its gate is high level. The low impedance is the on-resistance of transistor switch n0.

Clamp control circuit 102a includes two inverters and an AND circuit.

The two inverters are inserted in the gate signal line between first terminal T1 and the resistance element, and invert gate control signal Sp1 twice.

The AND circuit takes the logical AND of inverted gate control signal Sp1 and state determination signal S-jdg.

[1.2 Operation of Gate Drive Circuit]

Figure 2:
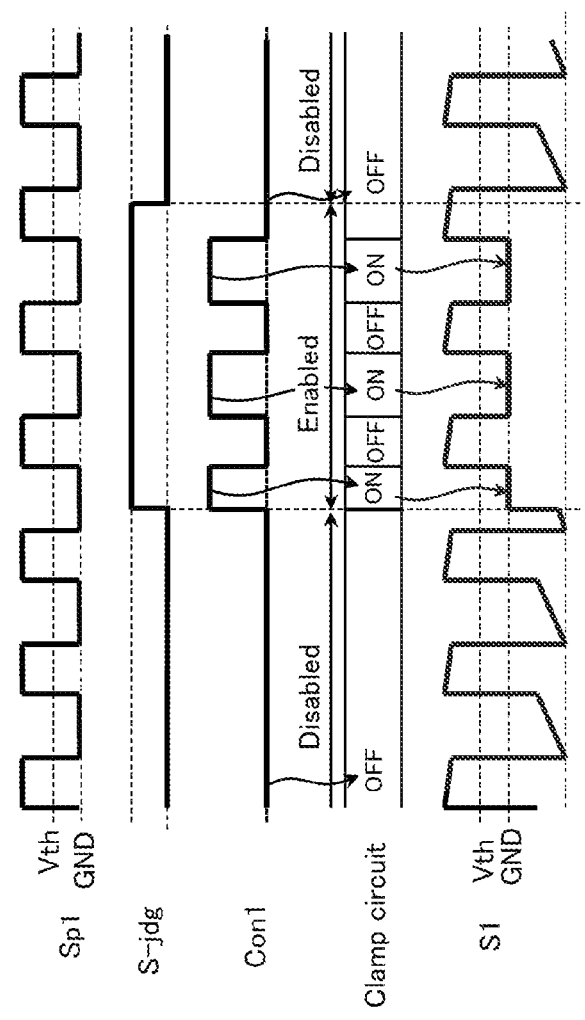
FIG. 2 is a time chart illustrating an example of the operation of the gate drive circuit according to Embodiment 1.

FIG. 2 is a time chart illustrating an example of the operation of gate drive circuit 100 in FIG. 1B according to Embodiment 1.

In the drawing, gate control signal Sp1 indicates to turn on switching element Q1 at high level, and indicates to turn off switching element Q1 at low level.

State determination signal S-jdg indicates the state in which false turn-on is unlikely to occur at low level, and indicates the state in which false turn-on is likely to occur at high level. In other words, state determination signal S-jdg indicates the state of impedance match at low level, indicating that the clamp operation is to be prohibited. State determination signal S-jdg indicates the state of impedance mismatch at high level, indicating that the clamp operation is to be performed.

Clamp control signal Con1 is a signal obtained by the logical AND of gate control signal Sp1 and state determination signal S-jdg. When state determination signal S-jdg is low level indicating to prohibit the clamp operation, clamp control signal Con1 is low level, and clamp circuit 101 is in the disabled state in which clamping is disabled.

Clamp circuit 101a is in the disabled state in which the clamp operation is prohibited when state determination signal S-jdg is low level, and is in the enabled state in which the clamp operation is not prohibited when state determination signal S-jdg is high level. Specifically, transistor switch n0 of clamp circuit 101a is off when clamp control signal Con1 is low level, and on when clamp control signal Con1 is high level.

Gate control signal S1 is negative voltage in the off period when the clamp operation of clamp circuit 101 is disabled. This is because the charge stored in capacitance element C1 in the on period is held without being discharged in the off period.

Gate control signal S1 is substantially ground level in the off period when the clamp operation of clamp circuit 101 is enabled. This is because the charge stored in capacitance element C1 in the on period is discharged by the clamp operation in the off period.

The advantages and disadvantages when the clamp operation of clamp circuit 101 is disabled and when the clamp operation of clamp circuit 101 is enabled will be described below.

When the clamp operation is disabled, the first gate is more susceptible to noise and false turn-on is more likely to occur than when the clamp operation is enabled. This is because the impedance of the first gate is relatively high when the clamp operation of clamp circuit 101 is disabled, which facilitates the entrance of noise components.

Moreover, when the clamp operation is disabled, the amount of charge and discharge of capacitance element C1 is smaller and the power consumption is lower than when the clamp operation is enabled.

As illustrated in FIG. 2, gate drive circuit 100 performs the clamp operation when false turn-on is likely to occur, and does not perform the clamp operation when false turn-on is unlikely to occur. Thus, both lower power consumption and suppression of false turn-on can be achieved.

As described above, gate drive circuit 100 according to Embodiment 1 is gate drive circuit 100 that drives switching element Q1 including a first drain, a first source, and a first gate, gate drive circuit 100 including: first terminal T1 to which a gate control signal is input; a gate signal line connecting first terminal T1 and the first gate; resistance element R1 inserted in the gate signal line; capacitance element C1 connected in parallel with resistance element R1; clamp circuit 101 that performs a clamp operation of clamping a voltage between the first gate and the first source to a voltage lower than a threshold voltage of switching element Q1 when the gate control signal indicates an off period of switching element Q1; and clamp control circuit 102 that controls whether to prohibit the clamp operation of clamp circuit 101 in the off period.

With this, both lower power consumption and suppression of false turn-on can be achieved.

A distance between (i) a connection point of clamp circuit 101 and the gate signal line and (ii) the first gate in the gate signal line may be less than a distance between the connection point and resistance element R1 in the gate signal line.

With this, the influence of the wiring inductor of the gate signal line in the vicinity of the gate is reduced, allowing more effective clamp operation.

Embodiment 2

[2.1 Structure of Gate Drive Circuit]

This embodiment describes a structural example in which a diode is added to the gate signal line and clamp switches are parallelized. This enhances the effect of suppressing false turn-on.

Figure 3:
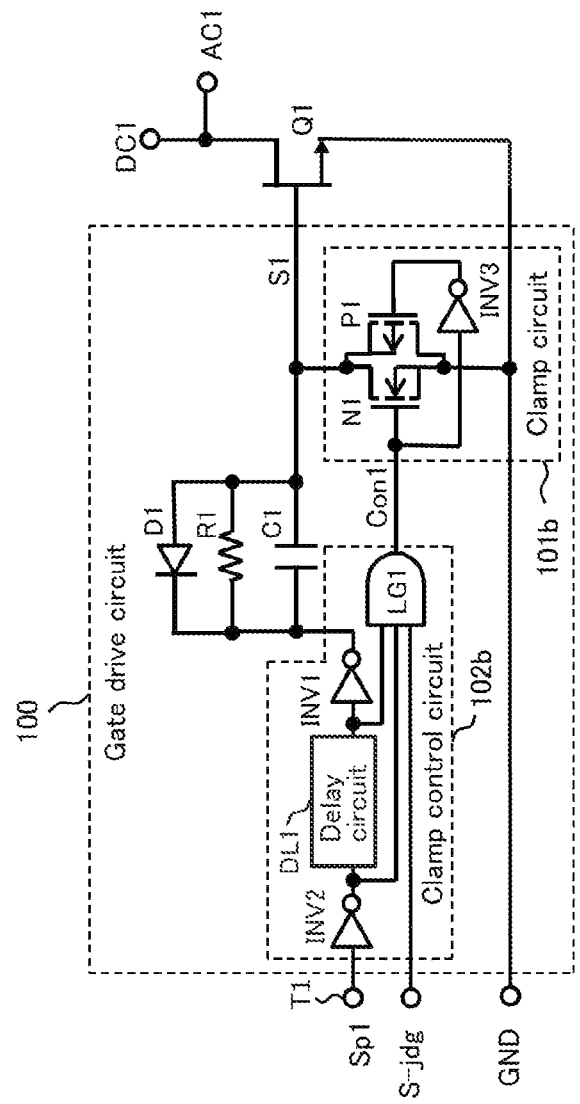
FIG. 3 is a diagram illustrating an example of the structure of a gate drive circuit according to Embodiment 2.

FIG. 3 is a diagram illustrating an example of the structure of a gate drive circuit according to Embodiment 2.

In the drawing, the differences from gate drive circuit 100 in FIG. 1A lie in that diode D1 is added and clamp circuit 101b and clamp control circuit 102b are provided instead of clamp circuit 101 and clamp control circuit 102. The differences in FIG. 3 from FIG. 1A will be mainly described below while omitting the description of the same parts.

Diode D1 is connected in parallel with resistance element R1. Diode D1 has an anode connected to the first gate. Diode D1 is, for example, a Zener diode whose forward drop voltage VF is lower than the threshold voltage of switching element Q1. In the case where the voltage of the first gate of switching element Q1 rises due to the reflected power component caused by a load mismatch, diode D1 suppresses the rise of the gate voltage to not more than forward drop voltage VF of diode D1, so that false turn-on can be further suppressed.

Clamp circuit 101b includes first clamp switch N1, second clamp switch P1, and inverter INV3.

First clamp switch N1 is an NMOS type first transistor switch connected between the first gate and the first source.

Second clamp switch P1 is a PMOS type second transistor switch connected in parallel with first clamp switch N1. The channel of the first transistor switch and the channel of the second transistor switch thus differ in polarity.

Inverter INV3 inverts a signal input to the gate of one of first clamp switch N1 and second clamp switch P1, and outputs the inverted signal to the gate of the other one of first clamp switch N1 and second clamp switch P1.

Thus, as a result of the two transistor switches being turned on, the clamp voltage between the first gate and the first source is substantially 0 V, i.e. lower than the threshold voltage of switching element Q1. Since the two transistor switches connected in parallel are used for clamping, the impedance between the gate and the source during clamping can be further lowered, and false turn-on can be further suppressed.

Clamp control circuit 102b includes inverter INV1, inverter INV2, delay circuit DL1, and combinational logic circuit LG1.

Inverter INV1 determines an inverted gate control signal output from delay circuit DL1, and outputs a non-inverted gate control signal to resistance element R1.

Inverter INV2 inverts a gate control signal from first terminal T1, and outputs the inverted gate control signal to delay circuit DL1.

Delay circuit DL1 delays the inverted gate signal output from inverter INV2, and outputs it to inverter INV1. The amount of delay by delay circuit DL1 is variable.

Combinatorial logic circuit LG1 generates clamp control signal Con1 as a timing signal indicating the timing of the off period of switching element Q1, based on the logical AND of the inverted gate control signal before the delay and the inverted gate control signal after the delay.

With clamp control signal Con1, the clamp period by clamp circuit 101b can be kept from exceeding the range of the off period of the switching element. Consequently, the clamp operation can be prevented from affecting the on period of the switching element.

Moreover, since the delay amount is adjustable, the clamp operation can be performed effectively without affecting the on period of switching element Q1.

The operation of gate drive circuit 100 according to Embodiment 2 will be described below.

Clamp control circuit 102b outputs high level to clamp control signal Con1 to turn on clamp circuit 101b, when switching element Q1 is in the off period (that is, gate control signal Sp1 is low level) and state determination signal S-jdg is high level (that is, false turn-on is likely to occur).

Here, the reflected-wave component flows from the drain of switching element Q1 through parasitic capacitance Cdg to the first gate as current Icg in the state of impedance mismatch, and current Icg is converted into voltage by the on-resistance of clamp circuit 101b, causing the potential between the gate and the source to rise. If this rising voltage does not exceed the threshold voltage of switching element Q1 (about 1.2 V in the case of a GaN switch), false turn-on does not occur. Forward drop voltage VF (for example, about 0.2 V) of diode D1 in Embodiment 2 is lower than the threshold voltage of switching element Q1. Therefore, a shunt path for Icg can be provided from the anode of diode D1 through the cathode to the sink transistor (usually an Nch transistor) of inverter INV1 in order to reduce the potential rise between the first gate and the first source that cannot be absorbed only by the on-resistance of clamp circuit 101.

As described above, gate drive circuit 100 according to Embodiment 2 includes diode D1 connected in parallel with resistance element R1 and having an anode connected to the first gate.

With this, even if the first gate voltage of switching element Q1 rises due to reflected power caused by a load mismatch, the rise of the gate voltage is limited to not greater than forward drop voltage VF of the diode, so that false turn-on can be further suppressed.

Clamp circuit 101 may include: first transistor switch N1 connected between the first gate and the first source; and second transistor switch P1 connected in parallel with the first transistor switch.

With this, as a result of the transistor switches being turned on, the clamp voltage between the first gate and the first source is substantially 0 V, i.e. lower than the threshold voltage of switching element Q1. Since the two transistor switches connected in parallel are used for clamping, the impedance between the gate and the source during clamping can be further lowered, and false turn-on can be further suppressed.

Gate drive circuit 100 may include: an inverter that inverts a signal input to a gate of one of first transistor switch N1 and second transistor switch P1 and outputs the signal inverted to a gate of an other one of first transistor switch N1 and second transistor switch P1, and a channel of the first transistor switch and a channel of the second transistor switch may differ in polarity.

With this, the two transistor switches connected in parallel in CMOS configuration are used for clamping, so that the impedance between the gate and the source during clamping can be further lowered and false turn-on can be further suppressed.

Clamp control circuit 102 may include: delay circuit DL1 that causes a delay of the gate control signal from first terminal T1; and combinational logic circuit LG1 that generates a timing signal indicating a timing of the off period of switching element Q1 based on a logical AND or logical OR of the gate control signal before the delay and the gate control signal after the delay, and clamp circuit 101 may perform the clamp operation depending on the timing signal.

With this, the clamp period by clamp circuit 101 can be kept from exceeding the range of the off period of switching element Q1. Consequently, the clamp operation can be prevented from affecting the on period of switching element Q1.

An amount of the delay by the delay circuit may be variable.

With this, the delay amount is adjustable, so that the clamp operation can be effectively performed without affecting the on period of switching element Q1.

Combinational logic circuit LG1 may receive input of an output state signal indicating a state of output power by switching of switching element Q1, and prohibit the clamp operation of clamp circuit 101 depending on the output state signal.

With this, whether to prohibit the clamp operation can be controlled dynamically depending on the state of the output power to the load. It is thus possible to achieve both low power consumption and suppression of false turn-on in a well-balanced manner.

Clamp control circuit 102 may prohibit the clamp operation of clamp circuit 101 depending on an output state signal indicating a state of output power by switching of switching element Q1.

With this, whether to prohibit the clamp operation can be controlled dynamically depending on the state of the output power to the load. It is thus possible to achieve both low power consumption and suppression of false turn-on in a well-balanced manner.

Embodiment 3

[3.1 Structure of Gate Drive Device]

This embodiment describes a structural example in which a state detection circuit that detects the state in which false turn-on is likely to occur is included.

Figure 4:
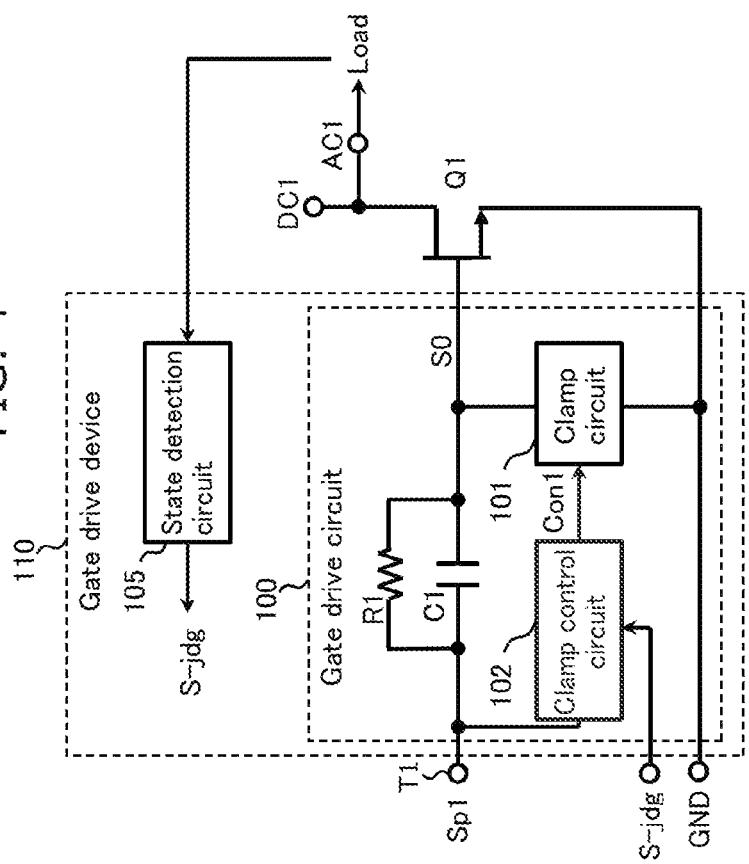
FIG. 4 is a diagram illustrating an example of the structure of a gate drive device according to Embodiment 3.

FIG. 4 is a diagram illustrating an example of the structure of a gate drive device according to Embodiment 3.

Gate drive device 110 in the drawing includes gate drive circuit 100 and state detection circuit 105. Switching element Q1 is also illustrated in the drawing.

Gate drive circuit 100 may be the same as that in FIG. 1A according to Embodiment 1, and therefore its description is omitted here.

State detection circuit 105 detects at least one parameter indicating the state of output power from switching element Q1, and converts the at least one parameter into respective at least one binarized parameter indicating whether there is a possibility of false turn-on by threshold determination. State detection circuit 105 further determines whether the at least one binarized parameter satisfies a predetermined condition, and generates the determination result as a binary output state signal.

Examples of the at least one parameter include (A) a parameter indicating the traveling-wave power of the output power, (B) a parameter indicating the reflected-wave power, (C) a parameter indicating the voltage value of the output power, (D) a parameter indicating the current value, (E) a parameter indicating the power value, (F) a parameter indicating the complex impedance of the load, and (G) a parameter indicating the temperature of switching element Q1.

The predetermined condition is, for example, an AND condition of one or more binarized parameters selected from the at least one binarized parameter. The predetermined condition may be an AND condition of all parameters (A) to (G). Alternatively, the predetermined condition may be an AND condition of one or more parameters selected from parameters (A) to (G). The predetermined condition may be an OR condition of one or more parameters selected from parameters (A) to (G). The predetermined condition may be determined according to load operating conditions, environmental conditions, and the like. The predetermined condition may be determined experimentally or empirically.

[3.2 Structure of Power Supply Device Including Gate Drive Device]

Figure 5:
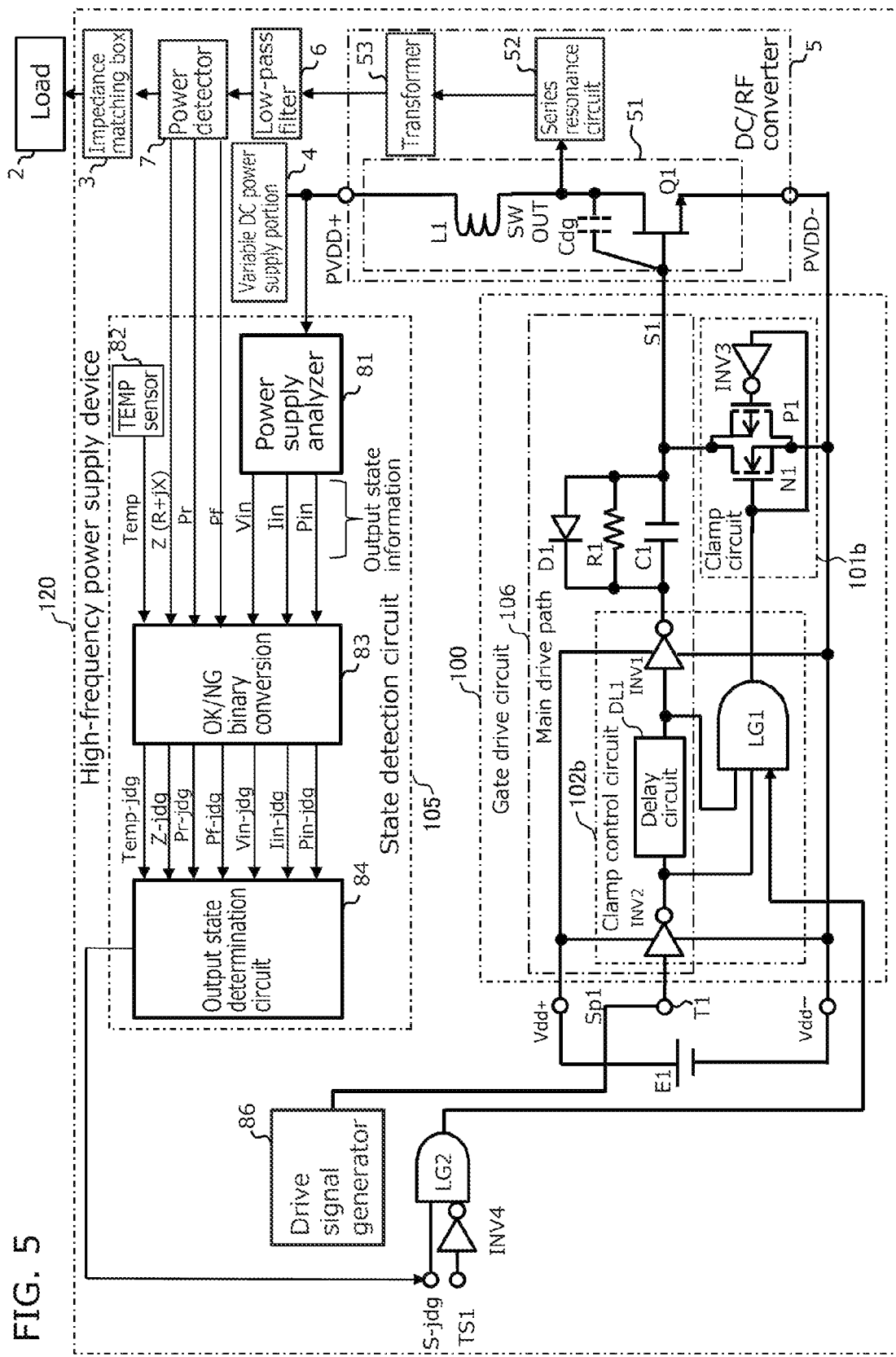
FIG. 5 is a diagram illustrating an example of the structure of a system including a high-frequency power supply device according to Embodiment 3.

FIG. 5 is a diagram illustrating an example of the structure of a system including a high-frequency power supply device according to Embodiment 3. Load 2 is also illustrated in the drawing.

High-frequency power supply device 120 in the drawing includes impedance matching box 3, variable DC power supply portion 4, DC/RF converter 5, low-pass filter 6, power detector 7, drive signal generator 86, gate drive circuit 100, state detection circuit 105, combinational logic circuit LG2, inverter INV4, and power supply E1.

Load 2 is, for example, a plasma generator. The plasma generator is a device that generates plasma by high-frequency power supplied from high-frequency power supply device 120, and is, for example, a plasma treatment device that performs treatment such as etching by irradiating a treatment object such as a semiconductor with plasma. A plasma load typically includes electrodes for plasma generation in a chamber, and generates plasma when high-frequency power is applied to the electrodes. The impedance of the plasma load varies finely depending on various conditions such as the magnitude of the power applied between the electrodes, the pressure of the gas inside the chamber, the flow rate of the gas supplied into the chamber, and the plasma generation time.

Impedance matching box 3 includes a variable capacitor or a variable inductor as an impedance variable element, and an operation mechanism for operating the impedance variable element using a motor as a drive source. To maximize the high-frequency power consumed by load 2, impedance matching box 3 adjusts the output impedance of high-frequency power supply device 120 and the impedance on the load 2 side as seen from high-frequency power supply device 120 so as to have a conjugate relationship. Since the output impedance of high-frequency power supply device 120 is usually designed to be 50Ω, impedance matching box 3 operates so as to make the impedance on the load 2 side as seen from high-frequency power supply device 120 equal to 50Ω. Impedance matching typically requires 100 milliseconds to several seconds. Reflection occurs at the load until the impedance is matched, so that the reflected-wave power returning to DC/RF converter 5 increases and the loss generated in the DC/RF converter increases.

Variable DC power supply portion 4 has a function of adjusting DC power to be output. For example, a DC-DC converter that forms the variable DC power supply portion includes an inverter that converts input DC power into AC power, a transformer that transforms the output of the inverter, a rectifier circuit that rectifies the output of the transformer, and a smoothing circuit that smooths the output of the rectifier circuit, and PWM-controls the output of the inverter depending on an output control signal (PWM control signal) to obtain DC power of any level.

DC/RF converter 5 includes switching circuit 51, series resonance circuit 52 to which the output of variable DC power supply portion 4 is supplied via switching circuit 51, and transformer 53 having a primary coil connected in series with series resonance circuit 52, and converts the DC output of variable DC power supply portion 4 into a high-frequency AC output through cooperation between switching circuit 51 and series resonance circuit 52.

Low-pass filter 6 removes harmonic components from the output of DC/RF converter 5.

Power detector 7 includes a directional coupler. Upstream of the output terminal of high-frequency power supply device 120, power detector detects the traveling-wave component of the high-frequency power supplied from DC/RF converter 5 to load 2 through low-pass filter 6 and the reflected-wave component of the high-frequency power that returns as a result of being reflected by the load, and outputs (A) traveling-wave component detection signal Pf and (B) reflected-wave component detection signal Pr having magnitudes proportional to the detected traveling-wave component and reflected-wave component. Power detector 7 also detects (F) complex impedance Z of load 2. Complex impedance Z is represented by R+jX.

Drive signal generator 86 generates gate control signal Sp1. For example, drive signal generator 86 may be implemented by a direct digital synthesizer (DDS) that outputs a signal having a pulse waveform at a desired frequency.

Gate drive circuit 100 may be the same as that in FIG. 3 according to Embodiment 2.

State detection circuit 105 may be the same as that in FIG. 4 according to Embodiment 3. FIG. 5 illustrates a more specific example of the structure of state detection circuit 105 than in FIG. 4. State detection circuit 105 includes power supply analyzer 81, TEMP sensor 82, binary conversion circuit 83, and output state determination circuit 84.

Power supply analyzer 81 detects (C) voltage value Vin, (D) current value Iin, and (E) power value Pin from variable DC power supply portion 4 to DC/RF converter 5.

TEMP sensor 82 is located as close to switching element Q1 as possible, and detects (G) temperature Temp of switching element Q1.

Binary conversion circuit 83 stores thresholds corresponding to parameters (A) to (F) in advance, and converts each of the parameters into a binarized parameter indicating whether false turn-on is likely to occur by threshold determination. As a result, (A) traveling-wave power Pf is converted into traveling-wave power determination code signal Pf-jdg. (B) reflected-wave power Pr is converted into reflected-wave power determination code signal Pr-jdg. (C) voltage value Vin is converted into voltage value determination code signal Vin-jdg. (D) current value Iin is converted into current value determination code signal Iin-jdg. (E) power value Pin is converted into power value determination code signal Pin-jdg. (F) impedance Z is converted into impedance determination code signal Z-jdg. (G) temperature Temp is converted into temperature determination code signal Temp-jdg. Each of determination code signals (A) to (G) indicates that false turn-on is likely to occur at high level, and indicates that false turn-on is unlikely to occur at low level.

Output state determination circuit 84 determines whether the binarized parameters output from binary conversion circuit 83, i.e. determination code signals (A) to (G), satisfy a predetermined condition, and outputs the determination result as binary state determination signal S-jdg. For example, the predetermined condition is an AND condition of one or more determination code signals selected from determination code signals (A) to (G). The predetermined condition may be an OR condition of one or more determination code signals selected from determination code signals (A) to (G). In FIG. 5, state determination signal S-jdg indicates that false turn-on is likely to occur at high level, and indicates that false turn-on is unlikely to occur at low level.

Combinational logic circuit LG2 is a test circuit that prohibits the clamp operation by forcing state determination signal S-jdg to a predetermined level depending on test signal TS1 input from outside.

Inverter INV4 receives input of positive logic test signal TS1 and outputs negative logic test signal TS1.

Power supply E1 supplies power supply voltages Vdd+ and Vdd− (i.e. GND) to gate drive circuit 100.

Figure 6:
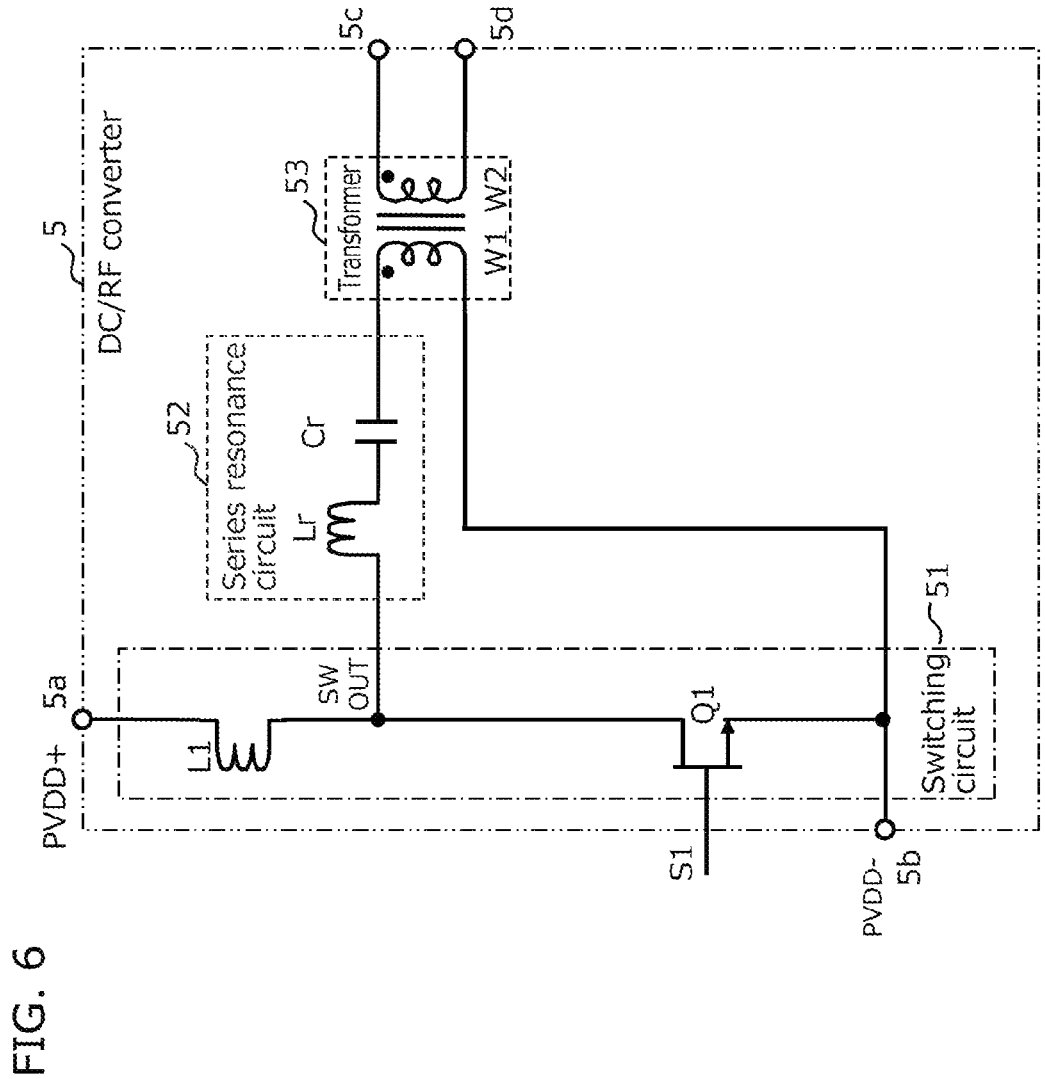
FIG. 6 is a diagram illustrating an example of the structure of a DC/RF converter included in the high-frequency power supply device according to Embodiment 3.

FIG. 6 is a diagram illustrating an example of the structure of the DC/RF converter included in the high-frequency power supply device according to Embodiment 3. DC/RF converter 5 in the drawing represents a structural example as a class E DC/RF converter, and includes switching circuit 51, series resonance circuit 52, and transformer 53.

Switching circuit 51 includes positive power supply terminal PVDD+, negative power supply terminal PVDD−, a load inductor (Lr) having a first end connected to positive power supply terminal PVDD+ and a second end connected to the drain of switching element Q1, and switching element Q1. Series resonance circuit 52 to which the first source of switching element Q1 and negative power supply terminal PVDD− are connected includes inductor Lr and capacitor Cr connected in series.

Transformer 53 includes primary winding W1 and secondary winding W2. Primary winding W1 is connected to series resonance circuit 52. Secondary winding W2 is connected to a circuit on the load 2 side. The circuit on the load 2 side is low-pass filter 6 in FIG. 5.

[3.3 Example of Operation of the Gate Drive Device]

Figure 7:
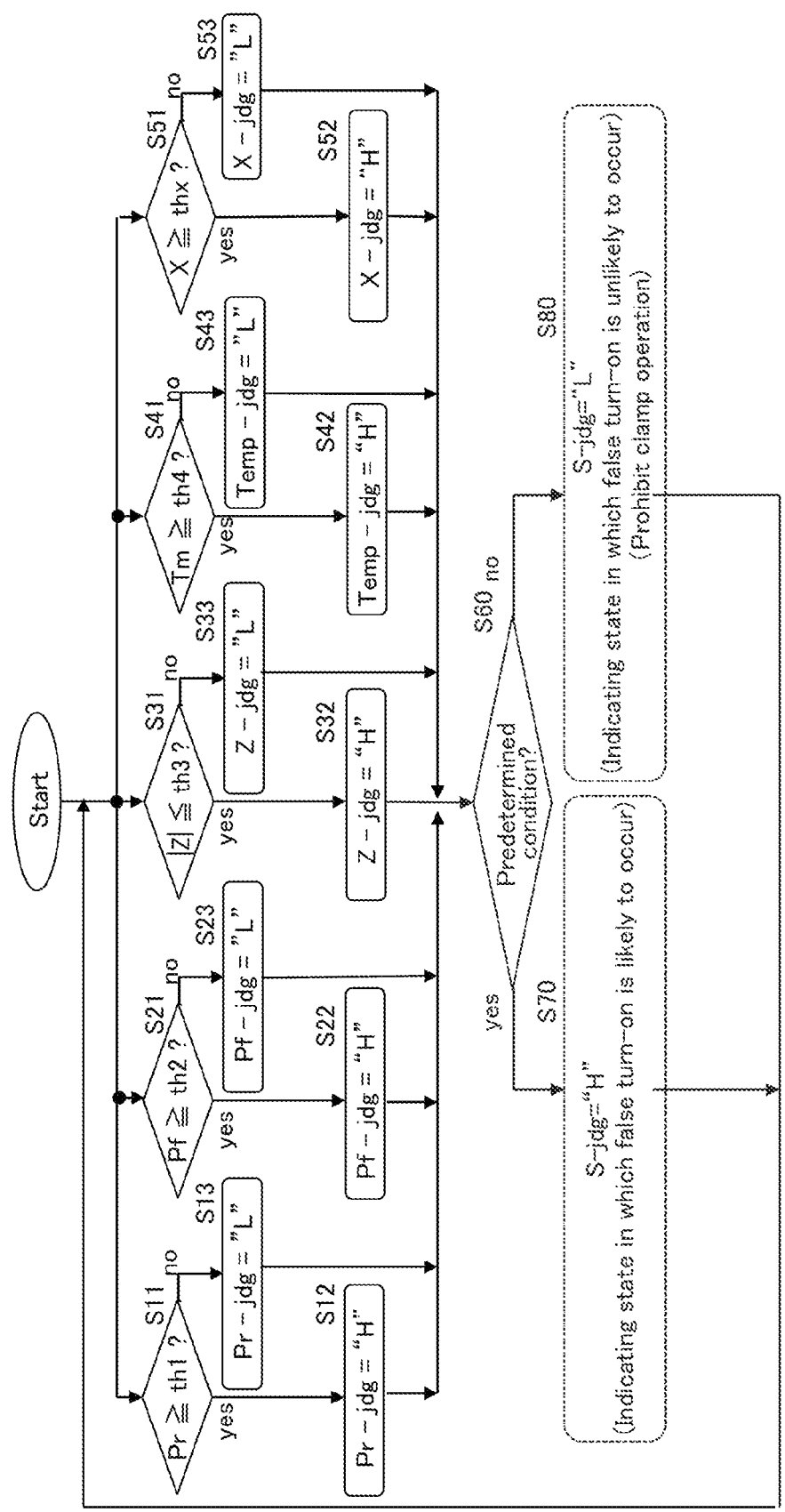
FIG. 7 is a flowchart illustrating an example of the operation of the gate drive device according to Embodiment 3.

FIG. 7 is a flowchart illustrating an example of the operation of the gate drive device according to Embodiment 3. In the drawing, Steps S11 to S13 represent a threshold determination process of converting (B) reflected-wave power Pr into reflected-wave power determination code signal Pr-jdg in binary conversion circuit 83. Threshold th1 is predetermined for reflected-wave power Pr.

Steps S21 to S23 represent a threshold determination process of converting (A) traveling-wave power Pf into traveling-wave power determination code signal Pf-jdg in binary conversion circuit 83. Threshold th2 is predetermined for traveling-wave power Pf.

Steps S31 to S33 represent a threshold determination process of converting (F) impedance Z into impedance determination code signal Z-jdg in binary conversion circuit 83. Threshold th3 is predetermined for impedance Z.

Steps S41 to S43 represent a threshold determination process of converting (G) temperature Temp into temperature determination code signal Temp-jdg in binary conversion circuit 83. Threshold th4 is predetermined for temperature Temp.

Steps S51 to S53 represent a threshold determination process of converting each of voltage value Vin, current value Iin, and power value Pin as parameter X into binarized parameter X-jdg in binary conversion circuit 83.

Specifically, a threshold determination process of converting (C) voltage value Vin into voltage value determination code signal Vin-jdg in binary conversion circuit 83 is represented. A threshold is predetermined for voltage value Vin.

Moreover, a threshold determination process of converting (D) current value Iin into current value determination code signal Iin-jdg is represented. A threshold is predetermined for current value Iin.

Moreover, a threshold determination process of converting (E) power value Pin into power value determination code signal Pin-jdg in binary conversion circuit 83 is represented. A threshold is predetermined for power value Pin.

After the conversion to the binarized parameters, output state determination circuit 84 determines whether binarized parameters (A) to (G) output from binary conversion circuit 83, i.e. determination code signals (A) to (G), satisfy a predetermined condition (S60). In the case where the predetermined condition is satisfied (S60: Yes), output state determination circuit 84 outputs state determination signal S-jdg at high level. In the case where the predetermined condition is not satisfied (S60: No), output state determination circuit 84 outputs state determination signal S-jdg at low level. The predetermined condition may be an AND condition of one or more determination code signals selected from determination code signals (A) to (G). The predetermined condition may be an OR condition of one or more determination code signals selected from determination code signals (A) to (G). In FIG. 7, state determination signal S-jdg indicates that false turn-on is likely to occur at high level, and indicates that false turn-on is unlikely to occur at low level.

Figure 8:
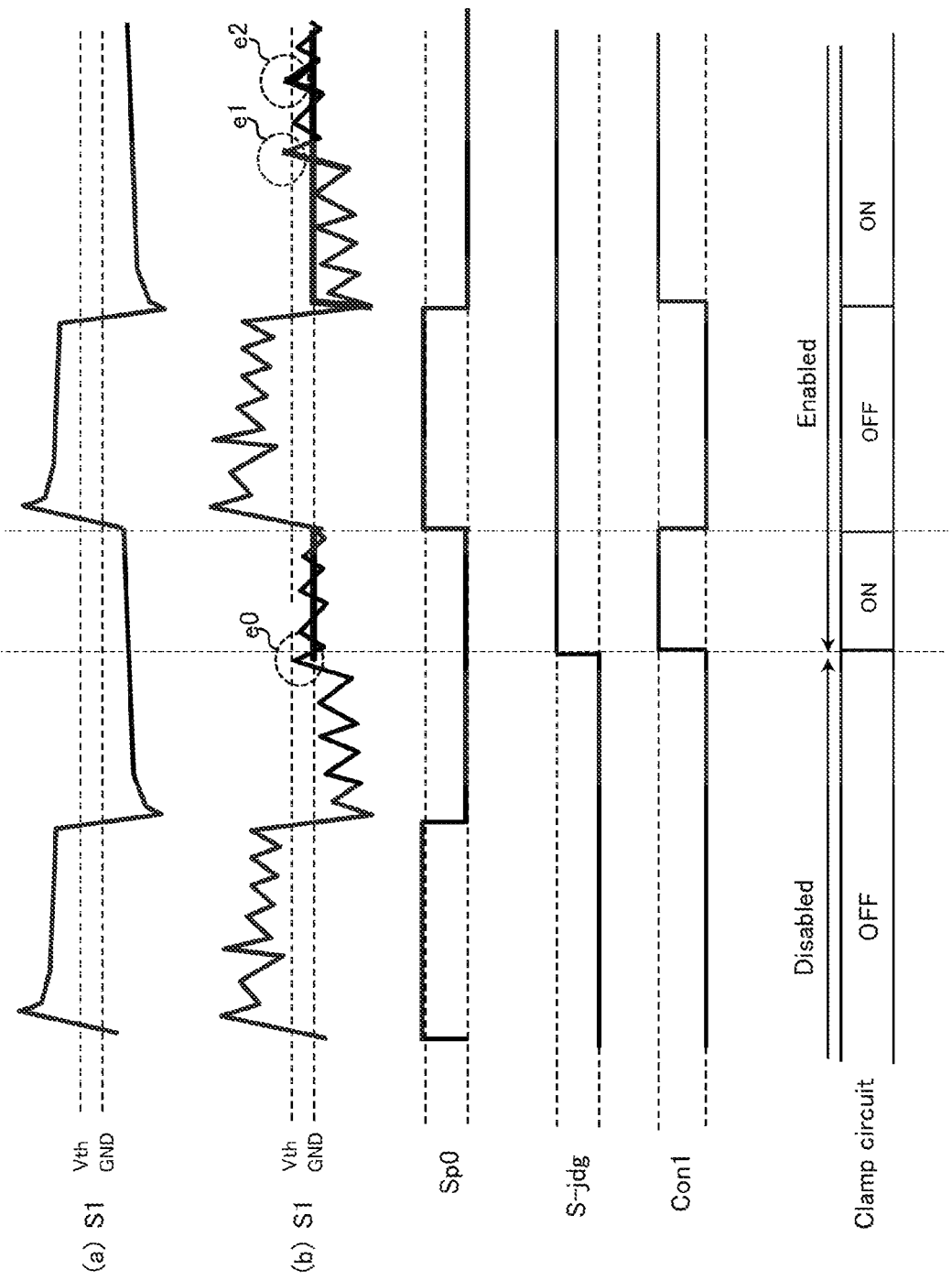
FIG. 8 is a time chart illustrating an example of the operation of the gate drive device according to Embodiment 3.

FIG. 8 is a time chart illustrating an example of the operation of the gate drive device according to Embodiment 3. (a) in the drawing schematically illustrates the waveform of gate control signal S1 when the impedances match. The jagged waveform in (b) in the drawing schematically illustrates the waveform of gate control signal S1 in the case where the clamp operation is prohibited when the impedances mismatch. The reflected-wave component of the high-frequency power from load 2 is superimposed on the waveform in (b) in the drawing as noise.

Dashed circle e0 in the drawing indicates the timing at which output state determination circuit 84 determines that false turn-on is likely to occur although the noise peak does not exceed threshold voltage Vth of switching element Q1. As a result of this determination, state determination signal S-jdg becomes high level. Accordingly, clamp circuit 101 changes from the disabled state to the enabled state at timing e0. After timing e0, gate control signal S1 is clamped to GND level in the off period of switching element Q1 as indicated by the thick solid line. For example, even when a noise peak exceeds threshold voltage Vth of switching element Q1 as indicated by dashed circles e1 and e2, the clamp operation can suppress false turn-on.

Figure 9:
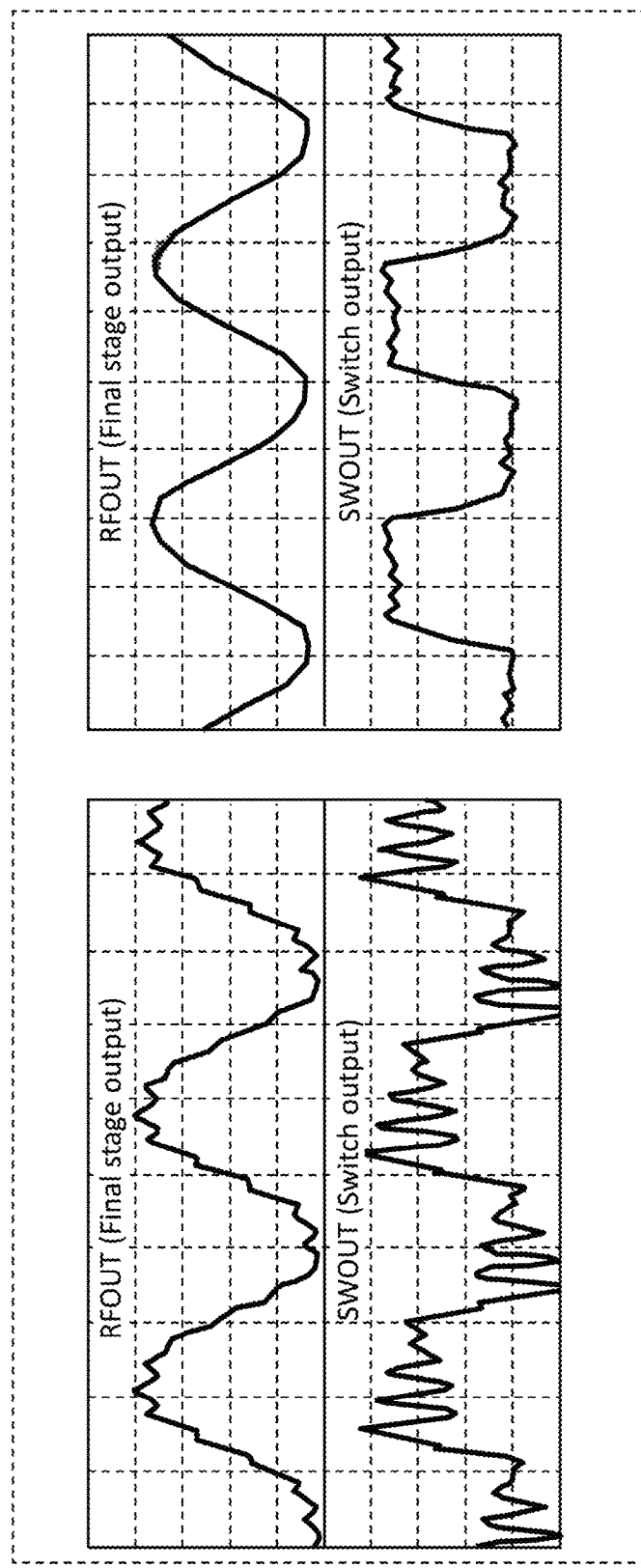
FIG. 9 is a diagram illustrating examples of the output waveform of the high-frequency power supply device according to Embodiment 3.

FIG. 9 is a diagram illustrating examples of the output waveform of the high-frequency power supply device according to Embodiment 3. "RFOUT" in the upper part of the drawing is the final stage output of high-frequency power supply device 120, and represents the waveform of high-frequency power supplied to load 2. "SWOUT" in the lower part of the drawing is the output of switching circuit 51, and represents the waveform of high-frequency power output from switching circuit 51.

The left side of the drawing illustrates the waveform of high-frequency power containing many reflected-wave components due to impedance mismatch. The right side of the drawing illustrates the waveform of high-frequency power with few reflected-wave components due to impedance match. Gate control signal S1 with little noise in (a) in FIG. 8 corresponds to the right side of FIG. 9. Gate control signal S1 with noise superimposed thereon in (b) in FIG. 8 corresponds to the left side of FIG. 9.

As described above, in gate drive circuit 100 according to Embodiment 3, the output state signal may be based on at least one of information indicating reflected-wave power of the output power or information indicating traveling-wave power of the output power.

With this, the output state signal indicates whether false turn-on is likely to occur, and therefore whether to prohibit the clamp operation can be controlled dynamically depending on the state of the output power to the load. Consequently, both lower power consumption and suppression of false turn-on can be achieved in a well-balanced manner.

Gate drive circuit 100 may include: a test circuit that prohibits the clamp operation by forcing the output state signal to a predetermined level, depending on a test signal input from outside.

With this, it is possible to compare, test, and evaluate the operation when the clamp operation is prohibited and the operation when the clamp operation is not prohibited. This allows clamp control circuit 102 to perform well-balanced clamp control that suppresses false turn-on and enables low power consumption driving.

Gate drive device 110 according to Embodiment 3 includes: gate drive circuit 100; and state detection circuit 105 that generates the output state signal, wherein state detection circuit 105: detects at least one parameter indicating a state of output power from switching element Q1; converts the at least one parameter into respective at least one binarized parameter indicating whether there is a possibility of false turn-on by threshold determination; determines whether the at least one binarized parameter satisfies a predetermined condition; and generates a determination result as the output state signal that is binary.

With this, the state of the output power that changes depending on the operation state of the load is detected. This allows the clamp control circuit to dynamically control whether to prohibit the clamp operation depending on the operation state of the load. Consequently, both lower power consumption and suppression of false turn-on can be achieved, and their balance can be dynamically optimized.

The at least one parameter may include a parameter indicating traveling-wave power of the output power and a parameter indicating reflected-wave power of the output power.

With this, an impedance mismatch, i.e. the possibility of false turn-on, can be estimated from the detection result of at least one of traveling-wave power or reflected-wave power. The output state signal as a result of threshold determination indicates whether false turn-on is likely to occur. Hence, the clamp control circuit can prohibit the clamp operation in the case where false turn-on is likely to occur, and perform the clamp operation without prohibiting it in the case where the possibility of false turn-on is not high.

The at least one parameter may include a parameter indicating a voltage value of the output power, a parameter indicating a current value of the output power, and a parameter indicating a power value of the output power.

With this, an impedance mismatch, i.e. the possibility of false turn-on, can be estimated from the detection result. The output state signal as a result of threshold determination indicates whether false turn-on is likely to occur. Hence, the clamp control circuit can prohibit the clamp operation in the case where false turn-on is likely to occur, and perform the clamp operation without prohibiting it in the case where the possibility of false turn-on is not high.

The predetermined condition may be an AND condition of one or more binarized parameters selected from the at least one binarized parameter.

With this, the clamp control circuit prohibits the clamp operation when the AND condition of part or all of the at least one binarized parameter is satisfied. Thus, the clamp operation can be prohibited in the case where false turn-on is likely to occur, and performed without being prohibited in the case where the possibility of false turn-on is not high.

High-frequency power supply device 120 according to Embodiment 3 includes gate drive device 110 and switching element Q1.

With this, both lower power consumption and suppression of false turn-on can be achieved.

High-frequency power supply device 120 may include: positive power supply terminal PVDD+; negative power supply terminal PVDD−; and load inductor L1 having a first end connected to the positive power supply terminal and a second end connected to the first drain of switching element Q1, and the first source of switching element Q1 and the negative power supply terminal may be connected to each other.

Such a high-frequency power supply device can be provided as a class E high-frequency power supply including gate drive circuit 100. Consequently, both lower power consumption and suppression of false turn-on can be achieved, and their balance can be dynamically optimized.

A system according to Embodiment 3 includes high-frequency power supply device 120 and a load connected to high-frequency power supply device 120.

With this, both lower power consumption and suppression of false turn-on can be achieved.

Embodiment 4

This embodiment describes high-frequency power supply device 120 of class D half-bridge configuration.
[4.1 Structure of Gate Drive Device]

Figure 10:
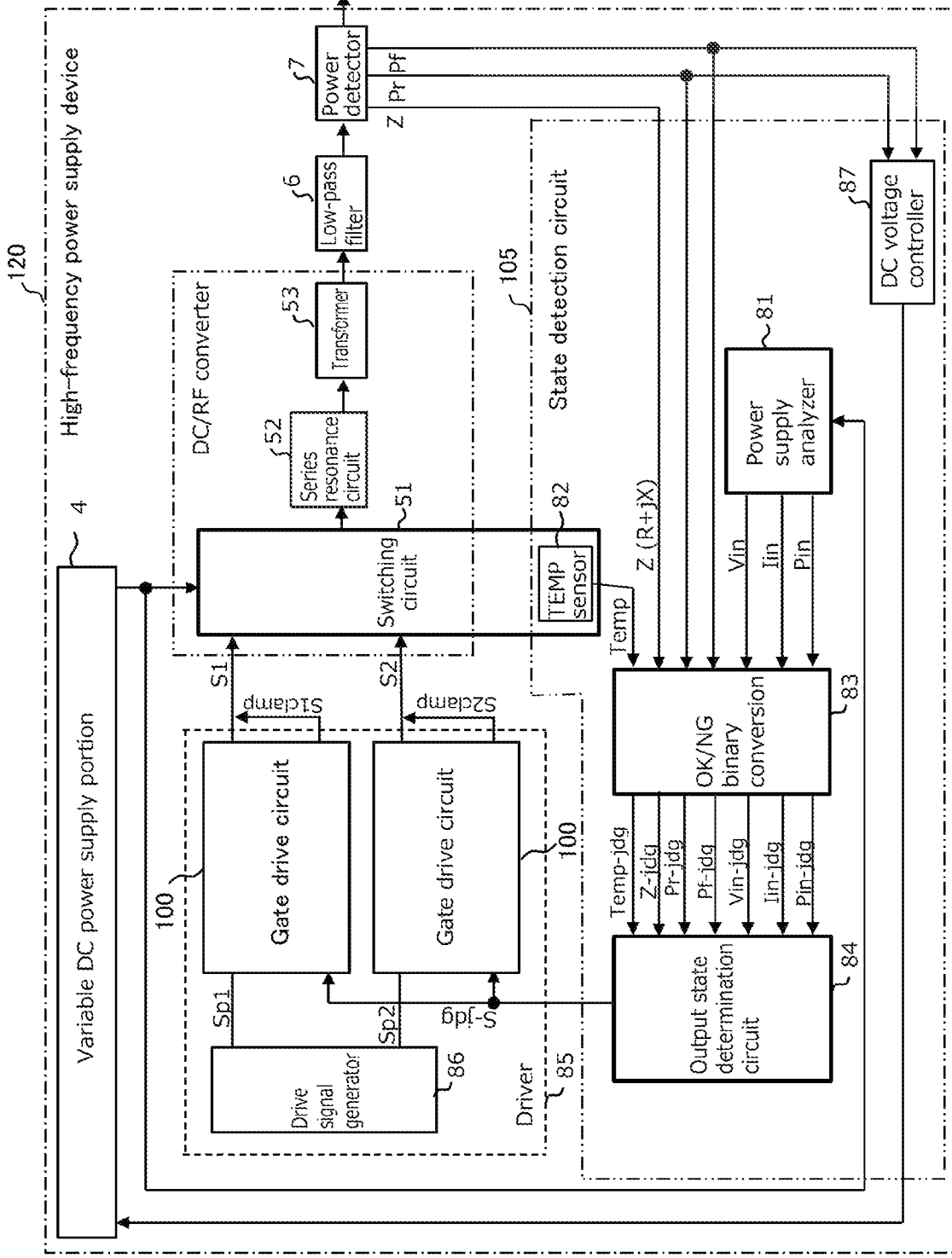
FIG. 10 is a diagram illustrating an example of the structure of a system including a high-frequency power supply device according to Embodiment 4.

FIG. 10 is a diagram illustrating an example of the structure of a system including a high-frequency power supply device according to Embodiment 4. In the drawing, the differences from FIG. 5 lie in that switching circuit 51 includes two switching elements Q1 and one more gate drive circuit 100 is added. The differences will be mainly described below.

Switching circuit 51 includes two switching elements connected in series between positive power supply terminal PVDD+ and negative power supply terminal PVDD−. The two switching elements are called first high side switch element Q1 and first low side switch element Q2 when they are distinguished from each other.

Two gate drive circuits 100 exclusively cause the two switching elements in switching circuit 51 to be conductive.

Figure 11:
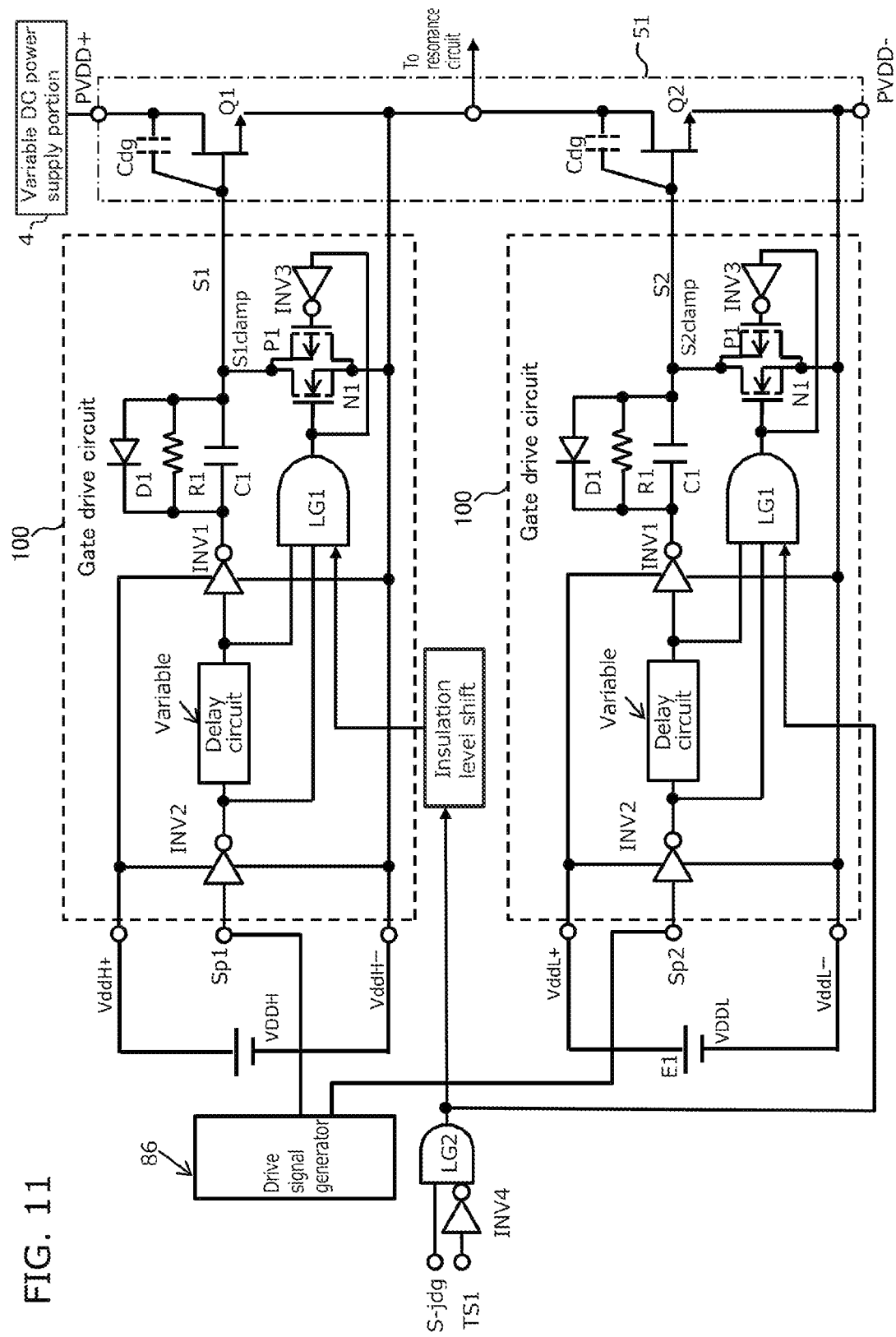
FIG. 11 is a diagram illustrating an example of the structure of gate drive circuits and switching circuits included in the high-frequency power supply device according to Embodiment 4.

FIG. 11 is a diagram illustrating an example of the structure of the gate drive circuits and the switching circuits included in the high-frequency power supply device according to Embodiment 4. As illustrated in the drawing, two gate drive circuits 100 correspond to first high side switch element Q1 and first low side switch element Q2. Drive signal generator 86 generates gate control signal Sp1 and gate control signal Sp2. The phases of gate control signal Sp1 and gate control signal Sp2 are reversed.

Figure 12:
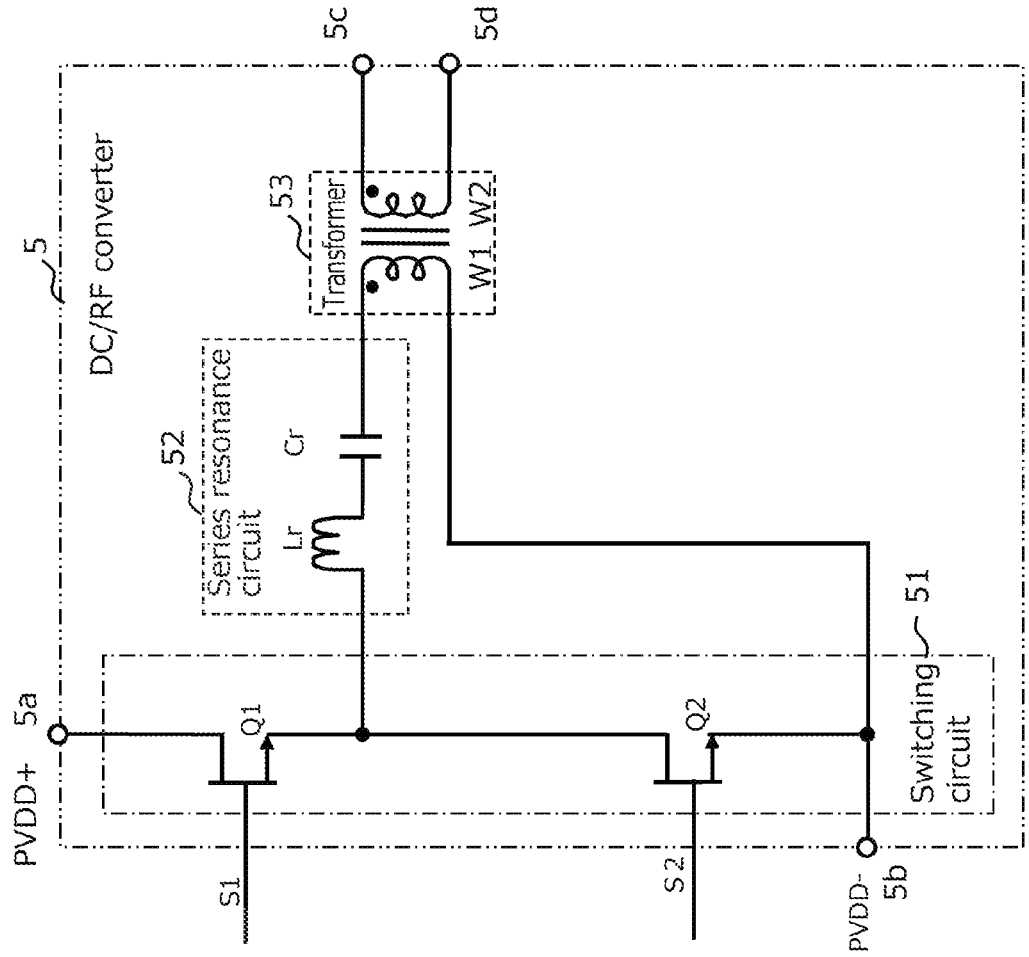
FIG. 12 is a diagram illustrating an example of the structure of a DC/RF converter included in the high-frequency power supply device according to Embodiment 4.

FIG. 12 is a diagram illustrating an example of the structure of the DC/RF converter included in the high-frequency power supply device according to Embodiment 4. As illustrated in the drawing, DC/RF converter 5 has class D half-bridge configuration, and includes first high side switch element Q1 and first low side switch element Q2.
[4.2 Operation of Gate Drive Device]

Figure 13:
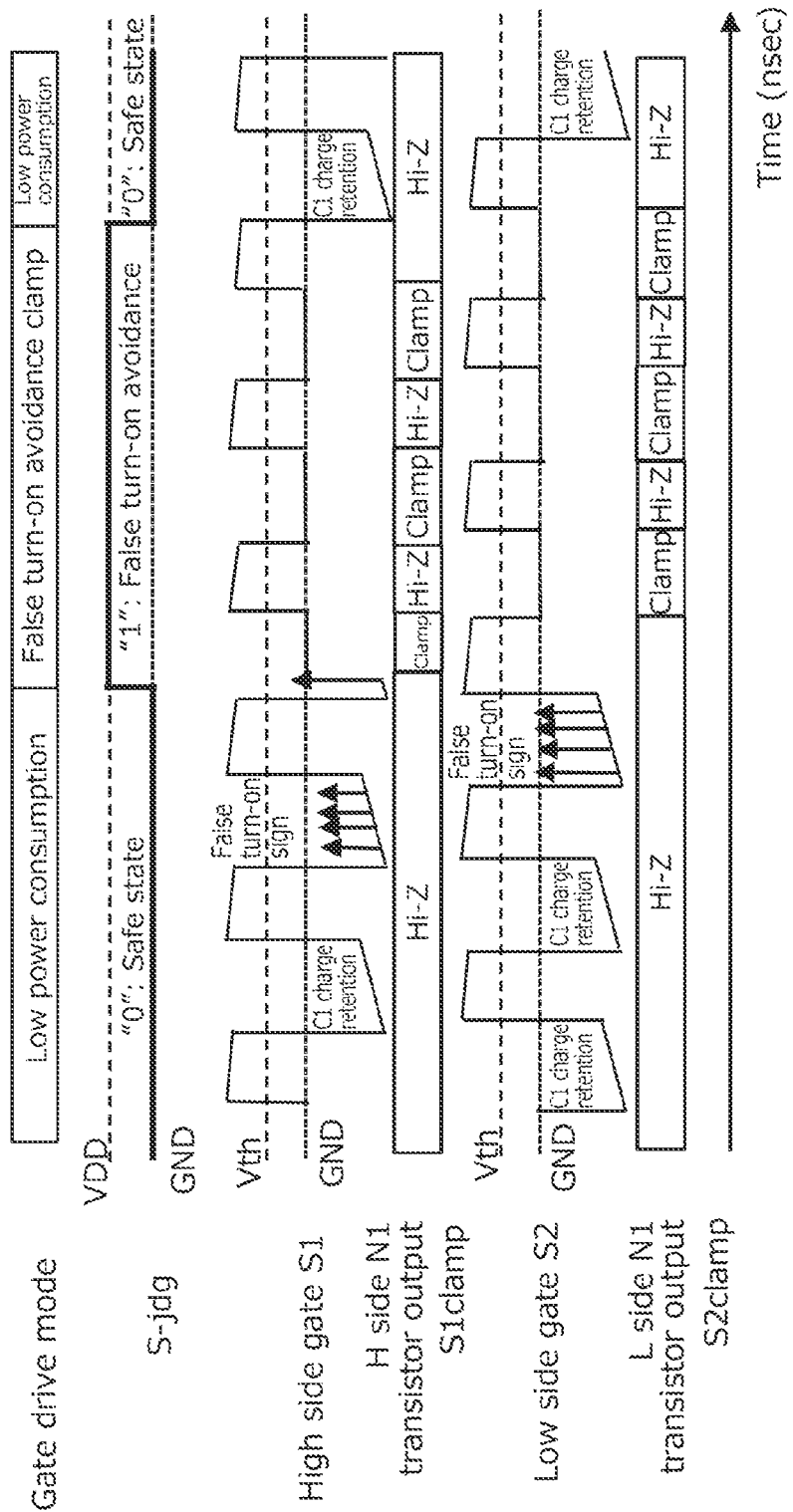
FIG. 13 is a time chart illustrating an example of the operation of the high-frequency power supply device according to Embodiment 4.

FIG. 13 is a time chart illustrating an example of the operation of the high-frequency power supply device according to Embodiment 4.

As illustrated in the drawing, two gate drive circuits 100 exclusively cause the two switching elements to be conductive.

Figure 14:
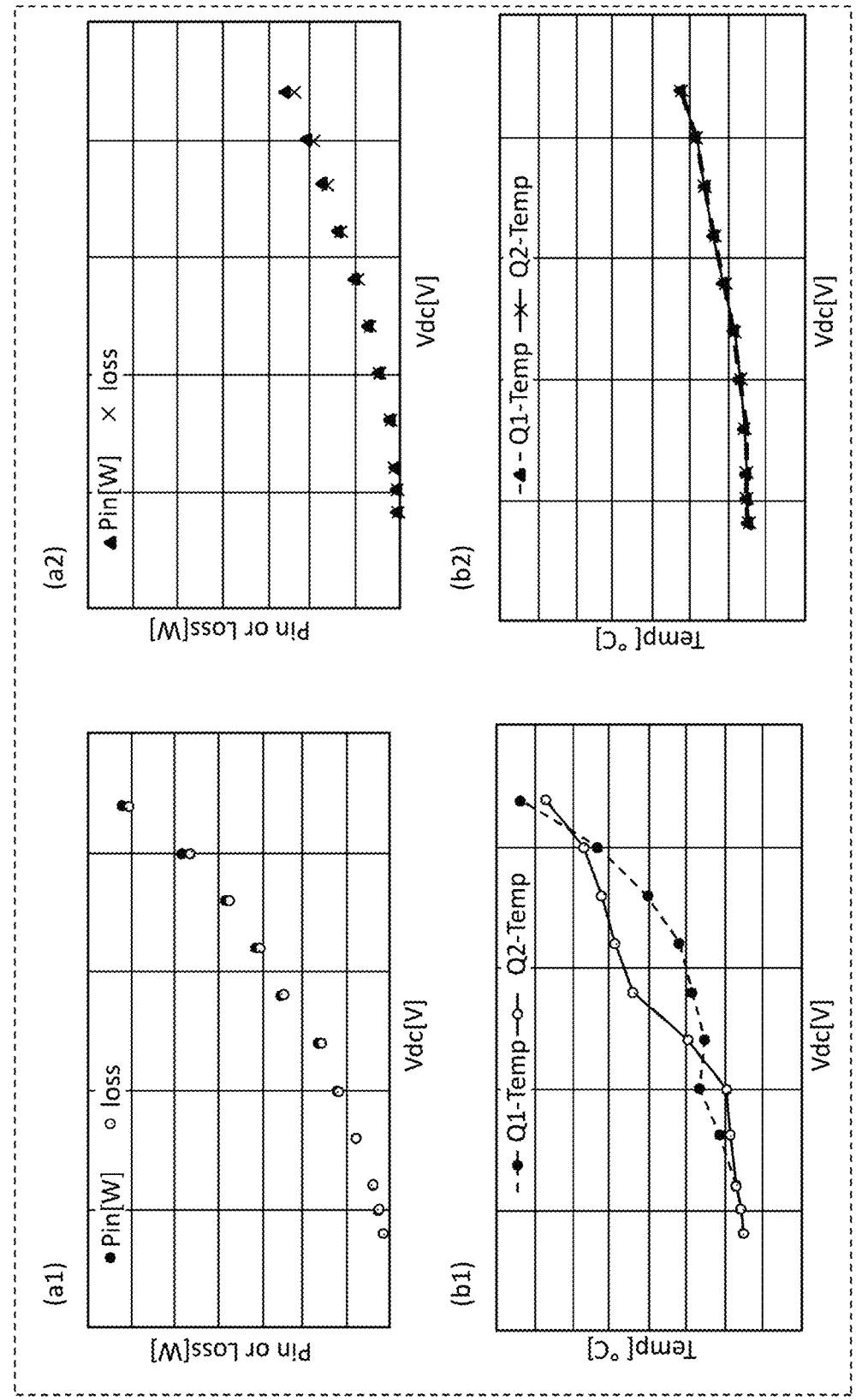
FIG. 14 is a diagram illustrating the relationship between the loss and the temperature depending on whether clamp operation is prohibited in the high-frequency power supply device according to Embodiment 4.

FIG. 14 is a diagram illustrating the relationship between the loss and the temperature depending on whether the clamp operation is prohibited in the high-frequency power supply according to Embodiment 4.

(a1) and (a2) in the upper part of the drawing illustrate the power loss with respect to the voltage of variable DC power supply portion 4. (b1) and (b2) in the lower part of the drawing illustrate the temperature with respect to the voltage of variable DC power supply portion 4. (a1) and (b1) on the left side of the drawing illustrate graphs when false turn-on occurs. (a2) and (b2) on the right side of the drawing illustrate graphs when false turn-on is prevented.

As illustrated on the right side of the drawing, by preventing false turn-on, the power loss and the temperature rise can be reduced as compared with the case where false turn-on occurs.

As described above, high-frequency power supply device 120 according to Embodiment 4 includes: positive power supply terminal PVDD+; negative power supply terminal PVDD−; two switching elements Q1 connected in series between positive power supply terminal PVDD+ and negative power supply terminal PVDD−; and two gate drive circuits corresponding to two switching elements Q1, and the two gate drive circuits exclusively cause two switching elements Q1 to be conductive.

Such a high-frequency power supply device can be provided as a high-frequency power supply of class D half-bridge configuration including gate drive device 110. Consequently, both lower power consumption and suppression of false turn-on can be achieved, and their balance can be dynamically optimized.

Embodiment 5

[5.1 Structure of Gate Drive Device]
This embodiment describes high-frequency power supply device 120 of class D full-bridge configuration.

Figure 15:
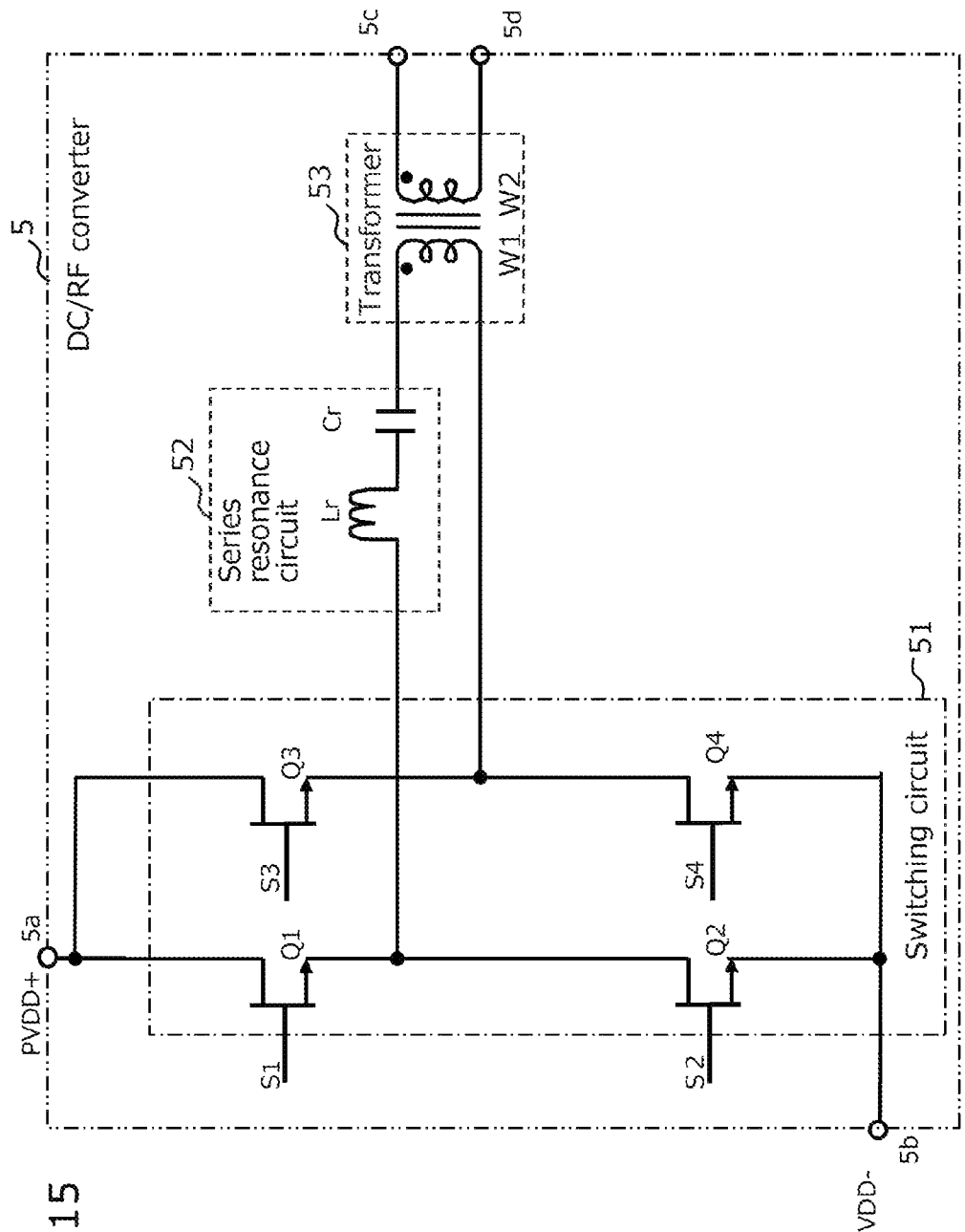
FIG. 15 is a diagram illustrating an example of the structure of a DC/RF converter included in a high-frequency power supply device according to Embodiment 5.

FIG. 15 is a diagram illustrating an example of the structure of the DC/RF converter included in the high-frequency power supply device according to Embodiment 5.

DC/RF converter 5 in the drawing includes four switching elements Q1 to Q4, forming a class D full-bridge circuit. In detail, switching circuit 51 includes: a first leg including two switching elements connected in series between positive power supply terminal PVDD+ and negative power supply terminal PVDD−; and a second leg including other two switching elements connected in series between positive power supply terminal PVDD+ and negative power supply terminal PVDD−. The first leg is composed of first high side switch element Q1 and first low side switch element Q2. The second leg is composed of second high side switch element Q3 and second low side switch element Q4.

Four gate drive circuits exclusively cause the two switching elements in the first leg to be conductive, exclusively cause the two switching elements in the second leg to be conductive, simultaneously cause the switching element as the high side switch in the first leg and the switching element as the low side switch in the second leg to be conductive, and simultaneously cause the switching element as the high side switch in the second leg and the switching element as the low side switch in the first leg to be conductive.

As described above, high-frequency power supply device 120 according to Embodiment 5 includes: positive power supply terminal PVDD+; negative power supply terminal PVDD−; a first leg including two switching elements Q1 and Q2 connected in series between positive power supply terminal PVDD+ and negative power supply terminal PVDD−; a second leg including other two switching elements Q3 and Q4 connected in series between positive power supply terminal PVDD+ and negative power supply terminal PVDD−; and four gate drive circuits corresponding to four switching elements Q1 to Q4, and the four gate drive circuits: exclusively cause two switching elements Q1 and Q2 in the first leg to be conductive; exclusively cause two switching elements Q3 and Q4 in the second leg to be conductive; simultaneously cause switching element Q1 as a high side switch in the first leg and switching element Q4 as a low side switch in the second leg to be conductive; and simultaneously cause switching element Q3 as a high side switch in the second leg and switching element Q2 as a low side switch in the first leg to be conductive.

Such a high-frequency power supply device can be provided as a high-frequency power supply of class D full-bridge configuration including gate drive device 110. Consequently, both lower power consumption and suppression of false turn-on can be achieved, and their balance can be dynamically optimized.

While a gate drive circuit, a gate drive device, a high-frequency power supply device, and a system according to one or more aspects have been described above by way of embodiments, the present disclosure is not limited to such embodiments. Other modifications obtained by applying various changes conceivable by a person skilled in the art to the embodiments and any combinations of the elements in different embodiments without departing from the scope of the present disclosure are also included in the scope of one or more aspects.

INDUSTRIAL APPLICABILITY

The gate drive circuit, gate drive device, high-frequency power supply device, and system according to the present disclosure can be used, for example, in semiconductor manufacturing equipment including plasma generators, $CO_2$ laser equipment, and the like.

The invention claimed is:

1. A gate drive circuit that drives a switching element including a first drain, a first source, and a first gate, the gate drive circuit comprising:
   a first terminal to which a gate control signal is input;
   a gate signal line connecting the first terminal and the first gate;
   a resistance element inserted in the gate signal line;
   a capacitance element connected in parallel with the resistance element;
   a clamp circuit that performs a clamp operation of clamping a voltage between the first gate and the first source to a voltage lower than a threshold voltage of the switching element when the gate control signal indicates an off period of the switching element; and
   a clamp control circuit that controls whether to prohibit the clamp operation of the clamp circuit in the off period; and
   a diode connected in parallel with the resistance element and including an anode connected to the first gate.

2. The gate drive circuit according to claim 1,
   wherein the clamp circuit includes:
   a first transistor switch connected between the first gate and the first source; and
   a second transistor switch connected in parallel with the first transistor switch.

3. The gate drive circuit according to claim 2, comprising:
   an inverter that inverts a signal input to a gate of one of the first transistor switch and the second transistor switch and outputs the signal inverted to a gate of another one of the first transistor switch and the second transistor switch,
   wherein a channel of the first transistor switch and a channel of the second transistor switch differ in polarity.

4. A gate drive circuit that drives a switching element including a first drain, a first source, and a first gate, the gate drive circuit comprising:
   a first terminal to which a gate control signal is input;
   a gate signal line connecting the first terminal and the first gate;
   a resistance element inserted in the gate signal line;
   a capacitance element connected in parallel with the resistance element;
   a clamp circuit that performs a clamp operation of clamping a voltage between the first gate and the first source to a voltage lower than a threshold voltage of the switching element when the gate control signal indicates an off period of the switching element; and
   a clamp control circuit that controls whether to prohibit the clamp operation of the clamp circuit in the off period,
   wherein the clamp control circuit includes:
   a delay circuit that causes a delay of the gate control signal from the first terminal; and
   a logic circuit that generates a timing signal indicating a timing of the off period of the switching element based on a logical AND or logical OR of the gate control signal before the delay and the gate control signal after the delay, and
   the clamp circuit performs the clamp operation depending on the timing signal.

5. The gate drive circuit according to claim 4,
   wherein an amount of the delay by the delay circuit is variable.

6. The gate drive circuit according to claim 4,
wherein the logic circuit receives input of an output state signal indicating a state of output power by switching of the switching element, and prohibits the clamp operation of the clamp circuit depending on the output state signal.

7. A gate drive circuit that drives a switching element including a first drain, a first source, and a first gate, the gate drive circuit comprising:
a first terminal to which a gate control signal is input;
a gate signal line connecting the first terminal and the first gate;
a resistance element inserted in the gate signal line;
a capacitance element connected in parallel with the resistance element;
a clamp circuit that performs a clamp operation of clamping a voltage between the first gate and the first source to a voltage lower than a threshold voltage of the switching element when the gate control signal indicates an off period of the switching element; and
a clamp control circuit that controls whether to prohibit the clamp operation of the clamp circuit in the off period,
wherein the clamp control circuit prohibits the clamp operation of the clamp circuit depending on an output state signal indicating a state of output power by switching of the switching element.

8. The gate drive circuit according to claim 6,
wherein the output state signal is based on at least one of information indicating reflected-wave power of the output power or information indicating traveling-wave power of the output power.

9. The gate drive circuit according to claim 6, comprising:
a test circuit that prohibits the clamp operation by forcing the output state signal to a predetermined level, depending on a test signal input from outside.

10. The gate drive circuit according to claim 1,
wherein a distance between (i) a connection point of the clamp circuit and the gate signal line and (ii) the first gate in the gate signal line is less than a distance between the connection point and the resistance element in the gate signal line.

11. A gate drive device comprising:
the gate drive circuit according to claim 7; and
a state detection circuit that generates the output state signal,
wherein the state detection circuit:
detects at least one parameter indicating a state of output power from the switching element;
converts the at least one parameter into respective at least one binarized parameter indicating whether there is a possibility of false turn-on by threshold determination;
determines whether the at least one binarized parameter satisfies a predetermined condition; and
generates a determination result as the output state signal that is binary.

12. The gate drive device according to claim 11,
wherein the at least one parameter includes a parameter indicating traveling-wave power of the output power and a parameter indicating reflected-wave power of the output power.

13. The gate drive device according to claim 11,
wherein the at least one parameter includes a parameter indicating a voltage value of the output power, a parameter indicating a current value of the output power, and a parameter indicating a power value of the output power.

14. The gate drive device according to claim 11,
wherein the predetermined condition is an AND condition of one or more binarized parameters selected from the at least one binarized parameter.

15. A high-frequency power supply device comprising:
the gate drive device according to claim 11; and
the switching element.

16. The high-frequency power supply device according to claim 15, comprising:
a positive power supply terminal;
a negative power supply terminal; and
a load inductor having a first end connected to the positive power supply terminal and a second end connected to the first drain,
wherein the first source and the negative power supply terminal are connected to each other.

17. The high-frequency power supply device according to claim 15, comprising:
a positive power supply terminal;
a negative power supply terminal;
two switching elements, each of which is the switching element, connected in series between the positive power supply terminal and the negative power supply terminal; and
two gate drive circuits, each of which is the gate drive circuit, corresponding to the two switching elements,
wherein the two gate drive circuits exclusively cause the two switching elements to be conductive.

18. The high-frequency power supply device according to claim 15, comprising:
a positive power supply terminal;
a negative power supply terminal;
a first leg including two switching elements, each of which is the switching element, connected in series between the positive power supply terminal and the negative power supply terminal;
a second leg including other two switching elements, each of which is the switching element, connected in series between the positive power supply terminal and the negative power supply terminal; and
four gate drive circuits, each of which is the gate drive circuit, corresponding to the two switching elements and the other two switching elements,
wherein the four gate drive circuits:
exclusively cause the two switching elements in the first leg to be conductive;
exclusively cause the other two switching elements in the second leg to be conductive;
simultaneously cause the switching element as a high side switch in the first leg and the switching element as a low side switch in the second leg to be conductive; and
simultaneously cause the switching element as a high side switch in the second leg and the switching element as a low side switch in the first leg to be conductive.

19. A system comprising:
the high-frequency power supply device according to claim 15; and
a load connected to the high-frequency power supply device.

* * * * *